US00RE45953E

(19) United States
(12) Reissued Patent
Dong et al.

(10) Patent Number: US RE45,953 E
(45) Date of Reissued Patent: Mar. 29, 2016

(54) MITIGATING CHANNEL COUPLING EFFECTS DURING SENSING OF NON-VOLATILE STORAGE ELEMENTS

(71) Applicant: SANDISK TECHNOLOGIES INC., Milpitas, CA (US)

(72) Inventors: Yingda Dong, San Jose, CA (US); Yan Li, Milpitas, CA (US); Cynthia Hsu, San Jose, CA (US)

(73) Assignee: SanDisk Technologies Inc., Plano, TX (US)

(21) Appl. No.: 14/285,446

(22) Filed: May 22, 2014

Related U.S. Patent Documents

Reissue of:
(64) Patent No.: 8,208,310
Issued: Jun. 26, 2012
Appl. No.: 12/773,701
Filed: May 4, 2010

(51) Int. Cl.
*G11C 16/06* (2006.01)
*G11C 11/56* (2006.01)
*G11C 16/34* (2006.01)

(52) U.S. Cl.
CPC ..... *G11C 11/5642* (2013.01); *G11C 16/3418* (2013.01)

(58) Field of Classification Search
CPC ..... G11C 11/5642; G11C 16/3418
USPC ..... 365/185.22, 185.25, 185.21, 185.01
See application file for complete search history.

(56) References Cited

U.S. PATENT DOCUMENTS

| | | | | |
|---|---|---|---|---|
| 6,956,770 | B2 | 10/2005 | Khalid et al. | |
| 7,064,980 | B2 | 6/2006 | Cernea et al. | |
| 7,206,235 | B1 | 4/2007 | Lutze et al. | |
| 7,215,574 | B2 | 5/2007 | Khalid et al. | |
| 7,508,721 | B2 * | 3/2009 | Li et al. | 365/189.11 |
| 2006/0221660 | A1 * | 10/2006 | Hemink et al. | 365/100 |
| 2007/0070704 | A1 * | 3/2007 | Ho et al. | 365/185.22 |
| 2008/0056005 | A1 * | 3/2008 | Aritome | 365/185.21 |
| 2008/0158986 | A1 * | 7/2008 | Elmhurst et al. | 365/185.21 |
| 2010/0202216 | A1 * | 8/2010 | Byeon | 365/185.25 |

FOREIGN PATENT DOCUMENTS

| | | | |
|---|---|---|---|
| CN | 1926635 | A | 3/2007 |
| CN | 101263560 | A | 9/2008 |
| WO | WO2004/029975 | A1 | 4/2004 |
| WO | 2010017013 | A1 | 2/2010 |

OTHER PUBLICATIONS

Chinese Office Action dated Jan. 12, 2015, Chinese Patent Application No. 201180022609.3.

(Continued)

*Primary Examiner* — Ovidio Escalante
(74) *Attorney, Agent, or Firm* — Vierra Magen Marcus LLP

(57) ABSTRACT

Channel coupling effects during verify and read of non-volatile storage are mitigated by matching the amount of channel coupling that occurs during read with channel coupling that occurred during verify. All bit lines may be read together during both verify and read. In one embodiment, first bias conditions are established on bit lines when verifying each of a plurality of programmed states. A separate set of first bias conditions may be established when verifying each state. Biasing a bit line may be based on the state to which a non-volatile storage elements on the bit line is being programmed. A separate set of second bias conditions are established for each state being read. The second bias conditions for a given state substantially match the first bias conditions for the given state.

30 Claims, 19 Drawing Sheets

(56) References Cited

OTHER PUBLICATIONS

Response to Office Action dated May 14, 2015, Chinese Patent Application No. 201180022609.3.
English translation of the claims filed in Response to Office Action dated May 14, 2015, Chinese Patent Application No. 201180022609.3.
English Abstract of Chinese Publication No. CN1926635 published on Mar. 7, 2007.
English Abstract of Chinese Publication No. CN101263560 published on Sep. 10, 2008.
Notice of Allowance U.S. Appl. No. 12/773,701, filed May 4, 2010, mailed Mar. 16, 2012.
International Search Report and Written Opinion of the International Searching Authority dated Aug. 17, 2011, PCT Application No. PCT/US2011/034951, filed May 3, 2011, 8 pages.

* cited by examiner

Fig. 6C
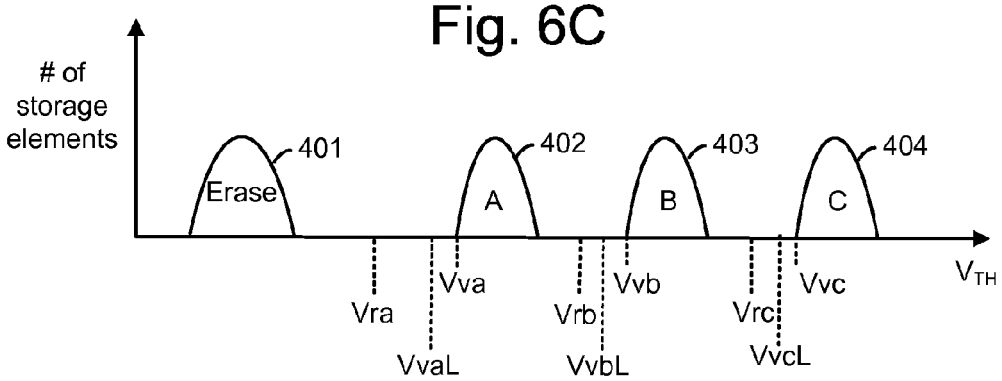
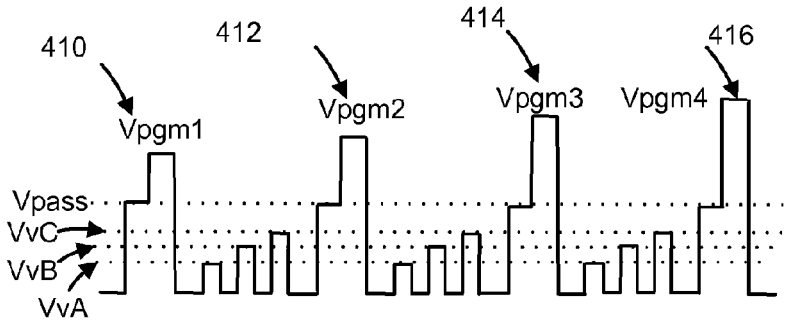
Fig. 6D $V_T$
$V_{vA}$
VvaL
time
$V_{BL}$
Vdd
$V_I$
time

1400

| VerifyA | Er | A | Aq | Ain | B | Bq | Bin | C | Cq | Cin |
|---|---|---|---|---|---|---|---|---|---|---|
| Data Latch = Erase (Er) | 1 | 0 | 0 | 1 | 0 | 0 | 1 | 0 | 0 | 1 |
| QPW (VvaL) | 0 | 0/1 | 1 | 1 | 0/1 | 1 | 1 | 0/1 | 1 | 1 |
| QPW OR ~Er | 0 | 1 | 1 | 1 | 1 | 1 | 1 | 1 | 1 | 1 |

Fig. 14A

1420

| VerifyA | Er | A | Aq | Ain | B | Bq | Bin | C | Cq | Cin |
|---|---|---|---|---|---|---|---|---|---|---|
| Data Latch = Erase OR A (Er\|A) | 1 | 1 | 1 | 1 | 0 | 0 | 1 | 0 | 0 | 1 |
| QPW (VvbL) | 0 | 0 | 0 | 0 | 0/1 | 1 | 1 | 0/1 | 1 | 1 |
| QPW OR ~(Er\|A) | 0 | 0 | 0 | 0 | 1 | 1 | 1 | 1 | 1 | 1 |

Fig. 14B

1440

| VerifyA | Er | A | Aq | Ain | B | Bq | Bin | C | Cq | Cin |
|---|---|---|---|---|---|---|---|---|---|---|
| Data Latch = Erase OR A OR B (Er\|A\|B) | 1 | 1 | 1 | 1 | 1 | 1 | 1 | 0 | 0 | 1 |
| QPW (VvcL) | 0 | 0 | 0 | 0 | 0 | 0 | 0 | 0/1 | 1 | 1 |
| QPW OR ~(Er\|A\|B) | 0 | 0 | 0 | 0 | 0 | 0 | 0 | 1 | 1 | 1 |

Fig. 14C

MITIGATING CHANNEL COUPLING EFFECTS DURING SENSING OF NON-VOLATILE STORAGE ELEMENTS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

1. Field of the Invention

This disclosure relates to non-volatile storage.

2. Description of the Related Art

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

In both EEPROM and flash memory, a memory cell includes a transistor with a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction of current between its source and drain is controlled by the level of charge on the floating gate. The memory cell may connected to a bit line to allow the conduction current to be sensed.

When programming a memory cell in an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Memory cells in some EEPROM and flash memory devices have a floating gate that is used to store two ranges of charges and, therefore, the memory cell can be programmed/erased between two states (an erased state and a programmed state).

A multi-state memory device stores multiple bits of data per memory cell by identifying multiple distinct valid threshold voltage (Vt) distributions (or data states). Each distinct Vt distribution corresponds to a predetermined value for the set of data bits encoded in the memory device. For example, a memory cell that stores two bits of data uses four valid Vt distributions. A memory cell that stores three bits of data uses eight valid Vt distributions.

One factor that affects the reading of memory cell's Vt is the channel potential of its neighbor memory cell (or cells). For example, if the neighbor's drain side channel potential is 0.4 volts, the apparent Vt of a memory cell may be different than if the neighbor's drain side channel potential is 0 volts.

Once a non-volatile storage element has been programmed, it is important that its programmed state can be read back with a high degree of reliability. However, differences in the neighbor's channel potential between when the memory cell was verified and later read can impact the apparent Vt of the memory cell. Hence, the memory cell might be read incorrectly.

One technique for reducing the differences between program verify and read conditions such as differences in channel potential is to sense only every other bit line during program verify and read. This keeps the neighbor's channel potential at 0V during both during program verify and read. However, by only reading every other bit line at a time, the time to verify and read may double. Because many program cycles may be needed, each with its own verify operations, doubling the number of verify operations for each program cycle can be detrimental to performance.

BRIEF DESCRIPTION OF THE DRAWINGS

FIG. 6C depicts an example set of threshold voltage distributions for a four-state memory device in which each storage element stores two bits of data.

FIG. 6D depicts a series of program and verify pulses which are applied to a selected word line during a programming operation.

FIG. 14A, FIG. 14B, and FIG. 14C depict tables that summarize conditions to illustrate one embodiment of how data from latches may be used to determine bit line bias conditions for verify.

DETAILED DESCRIPTION

Techniques are disclosed for improvements in operating non-volatile storage devices. The amount of channel coupling that a specific memory cell experiences from one or more neighbor memory cells during read may be matched to the amount of channel coupling that occurred from the neighbor(s) during verify. Therefore, differences in channel coupling between program verify and read are reduced or eliminated.

Note that the threshold voltage of the target memory cell being sensed may depend on the bit line bias of the neighbor memory cells. For example, if the neighbor's bit line is grounded, the threshold voltage of the target memory may be higher than if the neighbor's bit line is biased at Vbl (where Vbl may be, for example, 0.4V). On the other hand, if the neighbor's bit line is biased at Vbl, the threshold voltage of the target memory cell may be lower than if the neighbor's bit line is grounded. Embodiments include methods and devices that match the bit line bias conditions of neighbor bit lines during read of the target memory cell to the neighbor bit line bias conditions that were used during verify of the target memory cell. This may help to mitigate channel coupling effects.

Reducing such differences in channel coupling may improve accuracy in determining the memory cell's threshold voltage. Moreover, all of the bit lines can be read together during both verify and read. Therefore, verify are read are efficient. Note that during programming, one or more verify operations may be performed for each programming pulse. Therefore, reducing the number of verify operations following each programming pulse by sensing all bit lines together during verify may be quite beneficial. Furthermore, at least some of the bit lines may be grounded during at least some verify and read operations, which may save power. Also, the peak amount of current that is consumed may be reduced.

In some embodiments, the non-volatile storage elements are within a flash memory array. One example of a flash memory system uses the NAND structure, which includes arranging multiple transistors in series, sandwiched between two select gates. The transistors in series and the select gates are referred to as a NAND string. The NAND structure will be described as one example architecture; however, techniques described herein are not limited to the NAND architecture.

Figure 1:
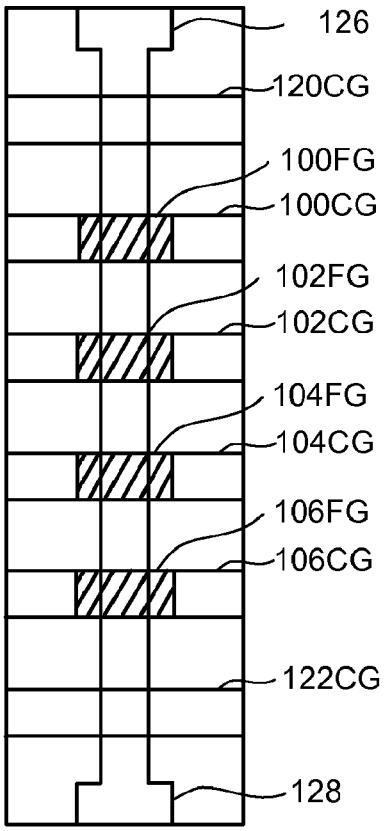
FIG. 1 is a top view of a NAND string.
Figure 2:
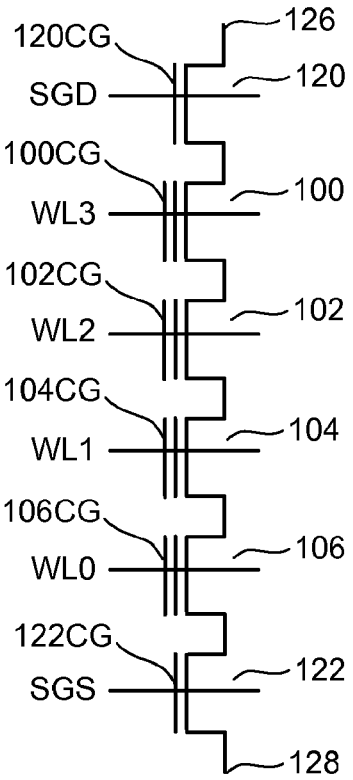
FIG. 2 is an equivalent circuit diagram of the NAND string.

FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages may be used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with embodiments. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
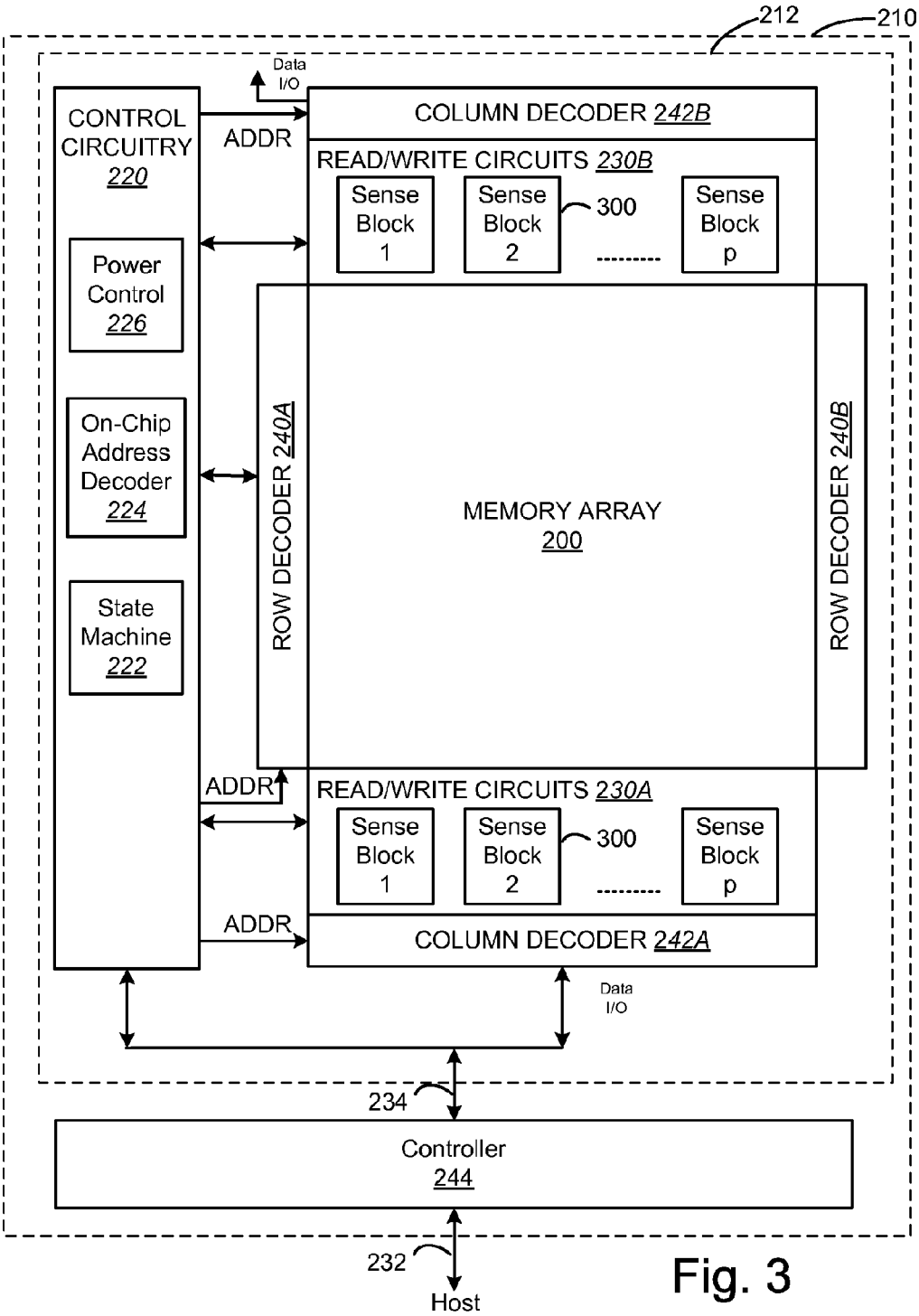
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
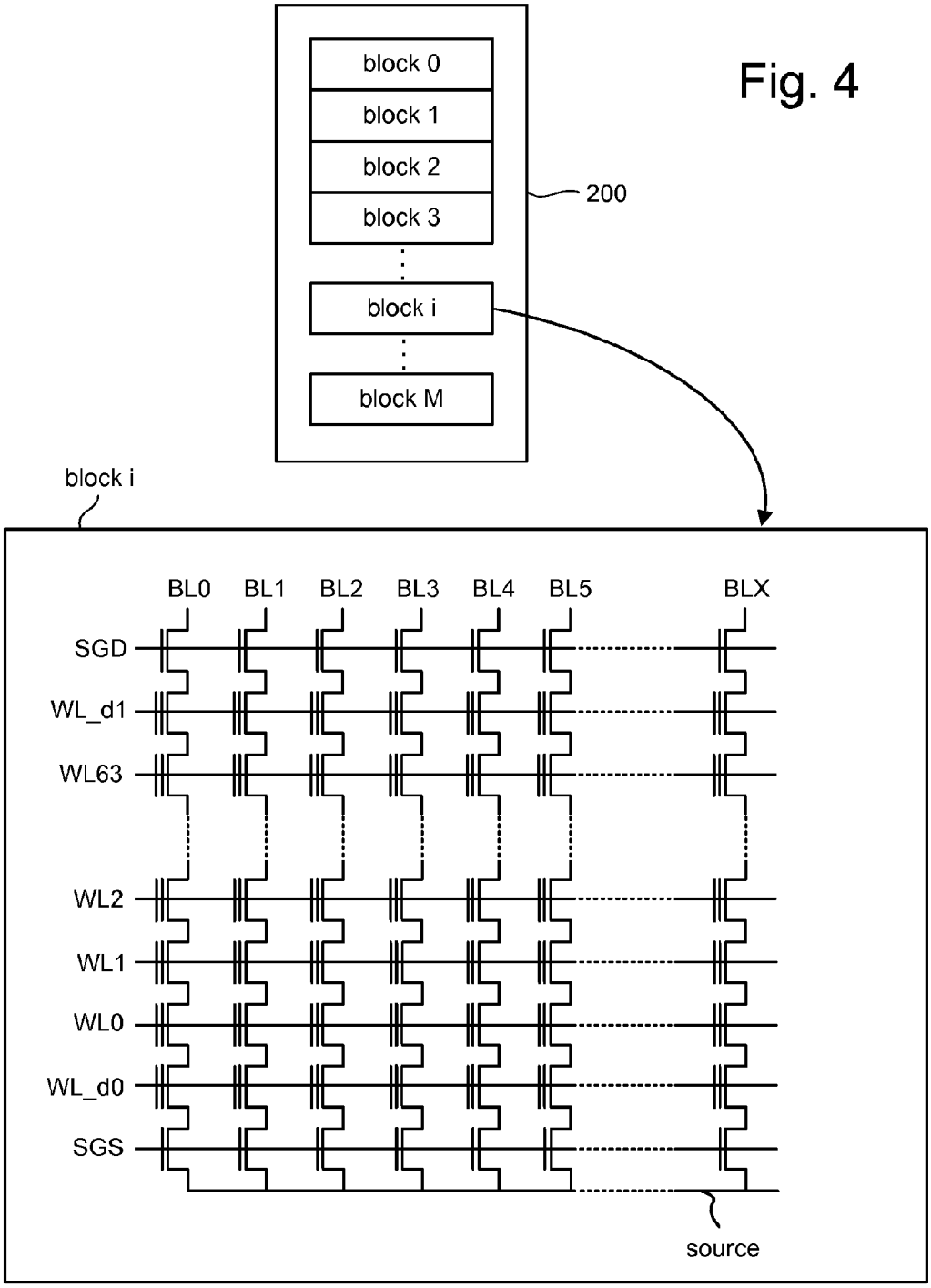
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 5:
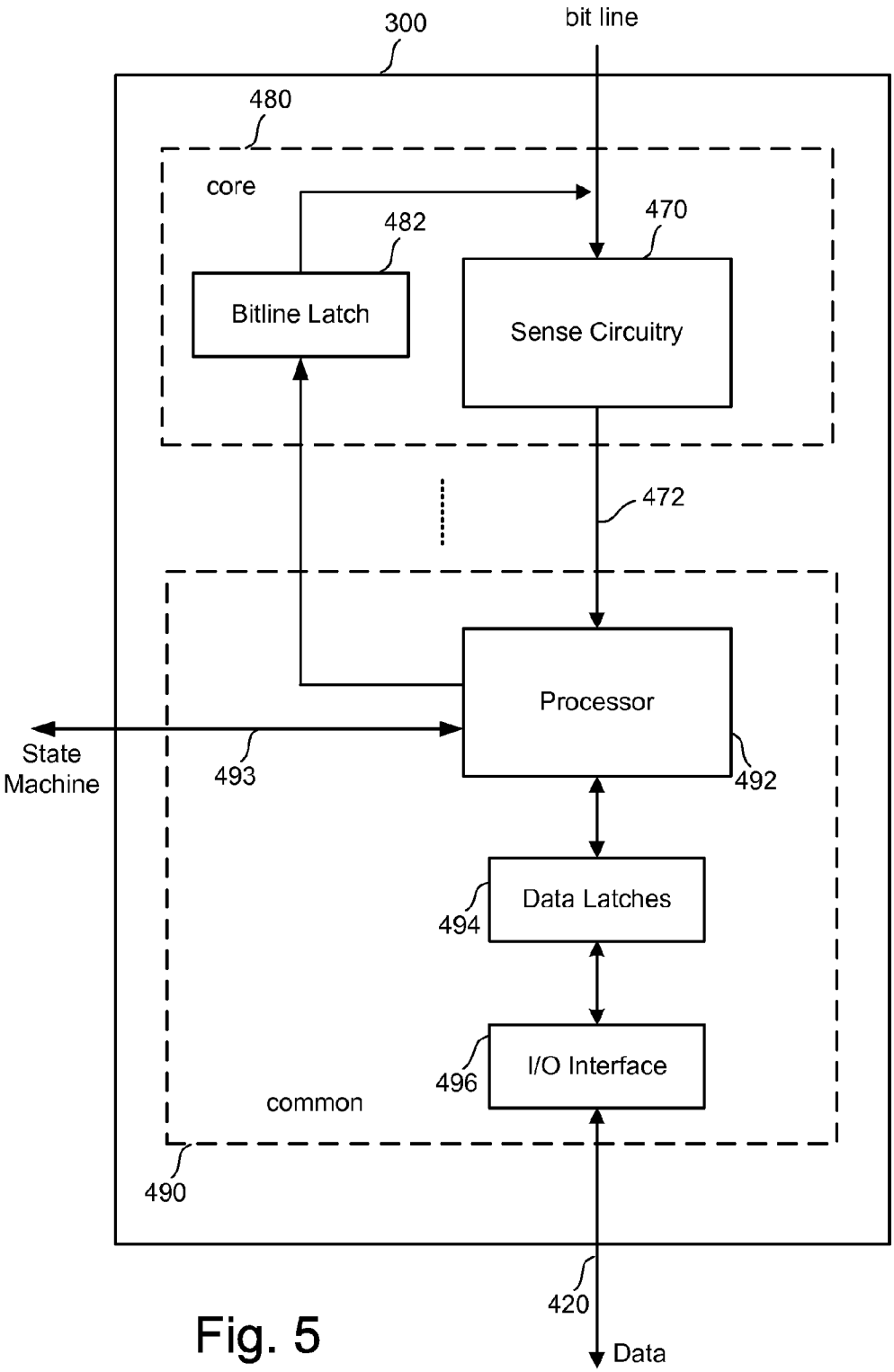
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd). In some embodiments, the voltage condition on each bit line during verify of a particular programmed state is matched to the voltage condition on each bit line during read of that particular programmed state.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. In some embodiments, the processor 492 determines what voltage should be applied to the bit line during verify and read. During verify, the processor 492 may make this determination based on the state to which the memory cell on the bit line is (or has been) programmed. During read, the processor 492 may make this determination based on a rough read of the memory cell to roughly determine what state is has been programmed to. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process. In some embodiments, even if the memory cell is inhibited from further programming, the bit line may be charged normally during the verify operation. In other words, even though verify is no longer needed for the cell on the bit line, the bit line is charged in a way that would allow a verify to be performed. This may allow the channel potential of a neighbor of a target memory cell being verified to match the neighbor's channel potential during read of the target memory cell.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non- Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 6A:
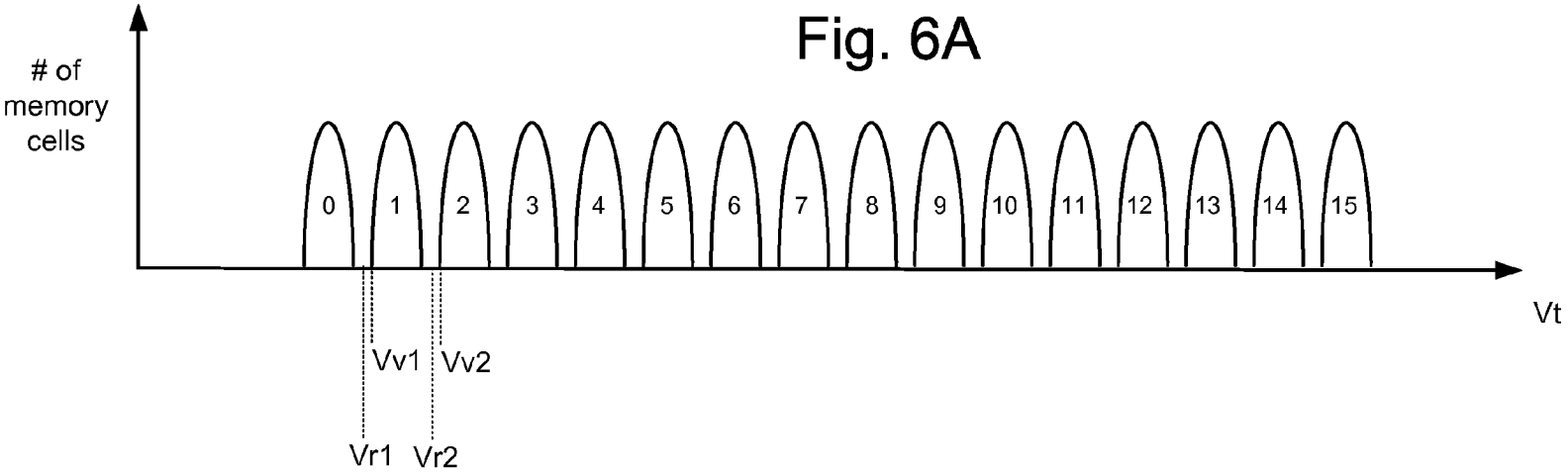
FIG. 6A depicts an example set of Vt distributions.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example threshold voltage distributions corresponding to data states for the memory cell array when each memory cell stores four bits of data. Other embodiment, however, may use more or less than four bits of data per memory cell. FIG. 6A shows 16 threshold voltage distributions corresponding to data states 0-15. In one embodiment, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6A shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6A shows Vv1 for state 1 and Vv2 for state 2. When programming memory cells to a given state, the system will test whether those memory cells have a threshold voltage greater than or equal to the verify reference voltage. In some embodiments, one data state (e.g., the lowest data state) is referred to as an erased state and all other data states are referred to as "programmed states."

Figure 6B:
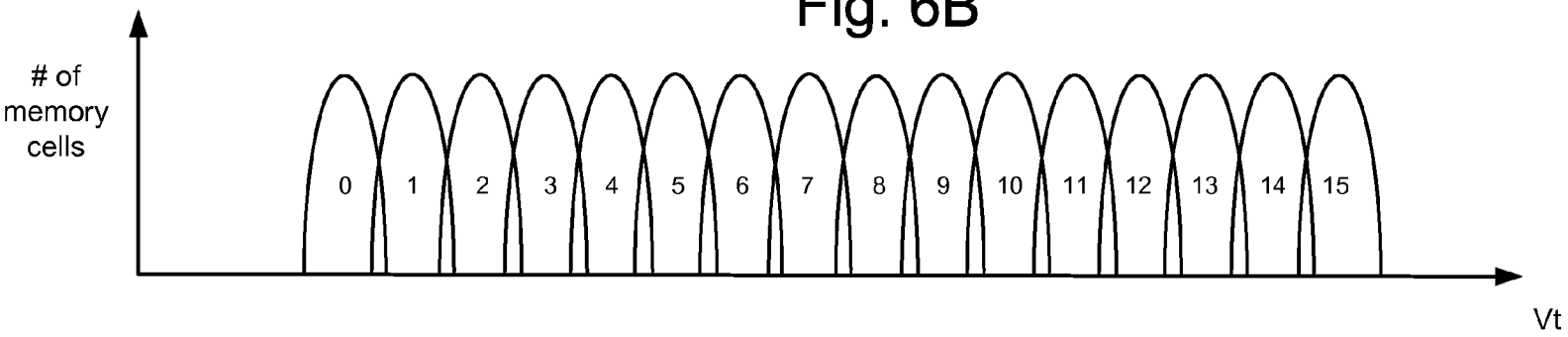
FIG. 6B depicts an example set of Vt distributions.

FIG. 6B illustrates that another embodiment of threshold voltage distributions corresponding to data states 0-15 can partially overlap since the correction algorithm can handle a certain percentage of cells that are in error.

Also note that the threshold voltage axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

In the example implementations of FIGS. 6A and 6B, the non-volatile storage elements store four bits of data per storage element, using four data states. FIG. 6C depicts an example set of threshold voltage distributions for a four-state memory device in which each storage element stores two bits of data. A first threshold voltage distribution 401 is provided for erased (Erased-state) storage elements. Three threshold voltage distributions 402, 403 and 404 represent programmed states A, B and C, respectively. In one embodiment, the threshold voltages in the Erased-state are negative, and the threshold voltages in the A-, B- and C-states are positive.

Read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, verify reference voltages, Vva, Vvb, and Vvc are provided. When programming storage elements to the A-state, B-state or C-state, the system will test whether those storage elements have a threshold voltage greater than or equal to Vva, Vvb or Vvc, respectively. In one embodiment, "verify low" reference voltages, Vval, Vvbl, and Vvcl are provided. Similar "verify low" reference voltages could also be used in embodiments with a different number of states. The verify low levels may be used during a "coarse verify," which will be described below.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 6D may be used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

One example of a slow programming mode uses low (offset) and high (target) verify levels for one or more programmed states. For example, VvaL and Vva are offset and target verify levels, respectively, for the A-state, and VvbL and Vvb are offset and target verify levels, respectively, for the B-state. During programming, when the threshold voltage of a storage element which is being programmed to the A-state as a target state (e.g., an A-state storage element) exceeds VvaL, its programming speed is slowed, such as by raising the bit line voltage to a level, e.g., 0.6-0.8 V, which is between a nominal program or non-inhibit level, e.g., 0 V and a full inhibit level, e.g., 2-3 V. This provides greater accuracy by avoiding large step increases in threshold voltage. When the threshold voltage reaches Vva, the storage element is locked out from further programming. Similarly, when the threshold voltage of a B-state storage element exceeds VvbL, its programming speed is slowed, and when the threshold voltage reaches Vvb, the storage element is locked out from further programming. In one approach, a slow programming mode is not used for the highest state since some overshoot is typically acceptable. Instead, the slow programming mode can be used for the programmed states below the highest state.

Moreover, in the example programming techniques discussed, the threshold voltage of a storage element is raised as it is programmed to a target programmed state. However, programming techniques can be used in which the threshold voltage of a storage element is lowered as it is programmed to a target programmed state. Programming techniques which measure storage element current can be used as well. The concepts herein can be adapted to different programming techniques.

FIG. 6D depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 410, 412, 414 and 416 have program voltages of Vpgm1, Vpgm2, Vpgm3 and Vpgm4, respectively, and so forth. A set of one or more verify voltages may be provided after each program pulse.

In FIG. 6D, three verify pulses are depicted between each program pulse. For example, verify pulse VvA may be used to verify whether memory cells that are targeted for the A-state have reached Vva, VvB may be used to verify whether memory cells that are targeted for the B-state have reached VvB, and VvC may be used to verify whether memory cells that are targeted for the C-state have reached VvC. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance. The voltage pulses depicted in FIG. 6D are for the final verify levels. There may also be pulses for the low verify levels of VvaL, VvbL, and VvcL.

Figure 7A:
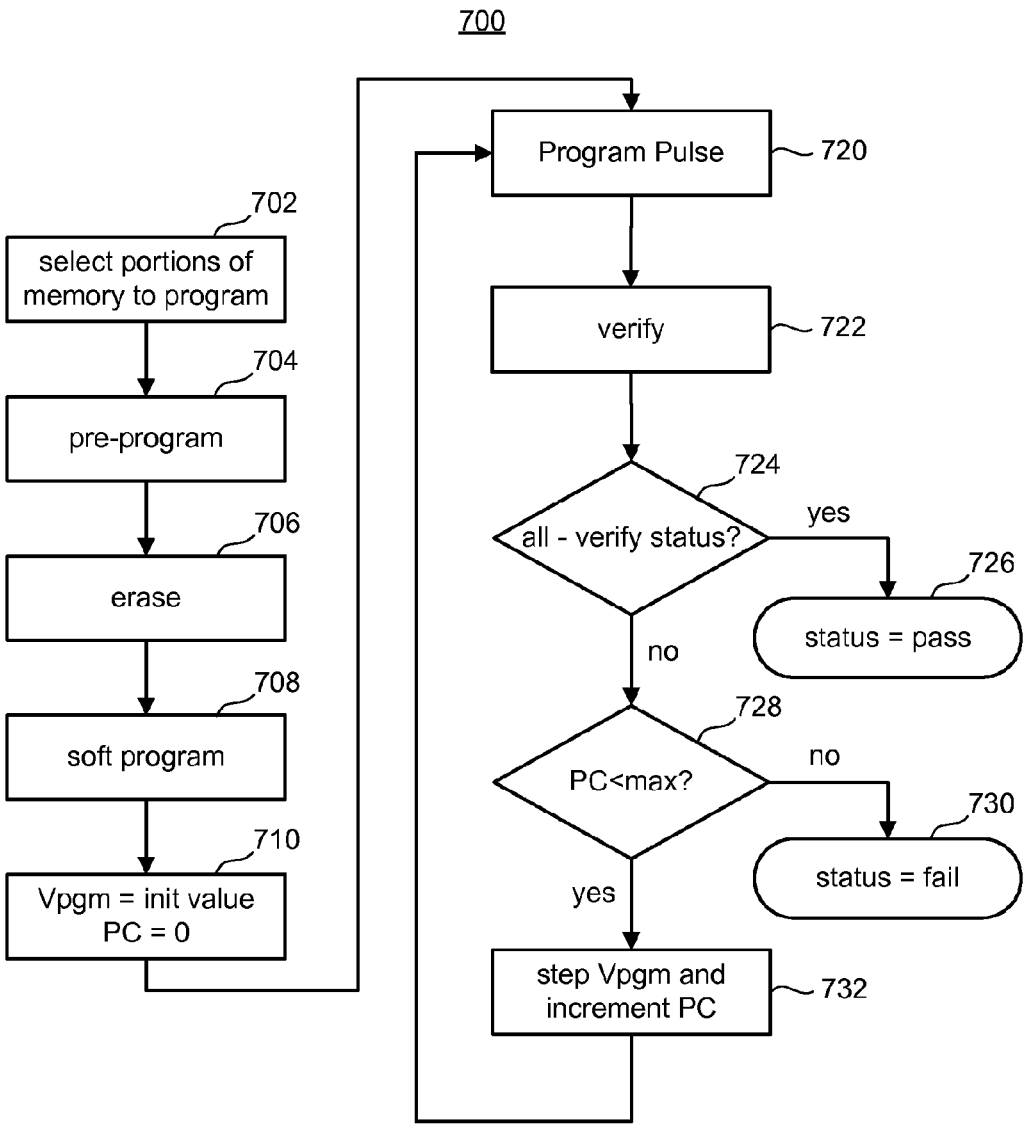
FIG. 7A is a flowchart describing one embodiment of a programming process, which includes one or more verification steps.

FIG. 7A is a flowchart describing one embodiment of a programming process 700, which includes one or more verification steps. In step 702, the portion of the memory to be programmed is selected. In one embodiment, this can be one or more write units appropriate to the memory structure. One example of a write unit is referred to as a page. In other embodiments, other units and/or structures can also be used. In step 704, a pre-programming process is sometimes used wherein the addressed memory cells are given non-data dependent programming to level out storage element wear and provide a more uniform starting point for the subsequent erase. In step 706, an erase process is performed, as appropriate for the type of storage element being used. One example of a suitable smart erase process is described in U.S. Pat. No. 5,095,344, incorporated herein by reference in its entirety. Step 708 includes a soft programming process designed to put the threshold voltages of erased memory cells into a more uniform starting range for the actual write phase. In one embodiment, if any of the memory cells fail to verify during erase (or during soft programming), they can be mapped out of the logical address space. At this point the memory is ready for the data conditional programming phase.

In step 710, the program voltage (Vpgm) is set to an initial value. Also, in step 710, a program counter (PC) is initialized to zero. In step 720, a program pulse is applied.

In step 722, a verification process is performed. In one embodiment, the verification is a concurrent coarse/fine verify. During the initial programming steps in which the memory cell's threshold is well below the final level (Vva), course programming is applied. However, after the memory cell's threshold voltage reaches VvaL, fine programming is used. Thus, while some memory cells are being verified for coarse programming, other memory cells are being verified for fine programming. Note that when a particular memory cell has been verified as being programmed to its intended state, it may be locked out from further programming. More details of step 722 are described below.

In step 724, it is determined whether all of the memory cells have verified that their threshold voltages are at the final target voltage for that memory cell. If so, the programming process is completed successfully (status=pass) in step 726. If all of the memory cells are not all verified, then it is determined whether the program counter (PC) is less than a maximum value, such as 20. If the program counter (PC) is not less than max (step 728), then the program process has failed (step 730). If the program counter (PC) is less than 20, then the program counter (PC) is incremented by 1 and the program voltage is stepped up to the next pulse in step 732. Subsequent to step 732, the process loops back to step 720 and the next program pulse is applied to the memory cells.

Figure 7B:
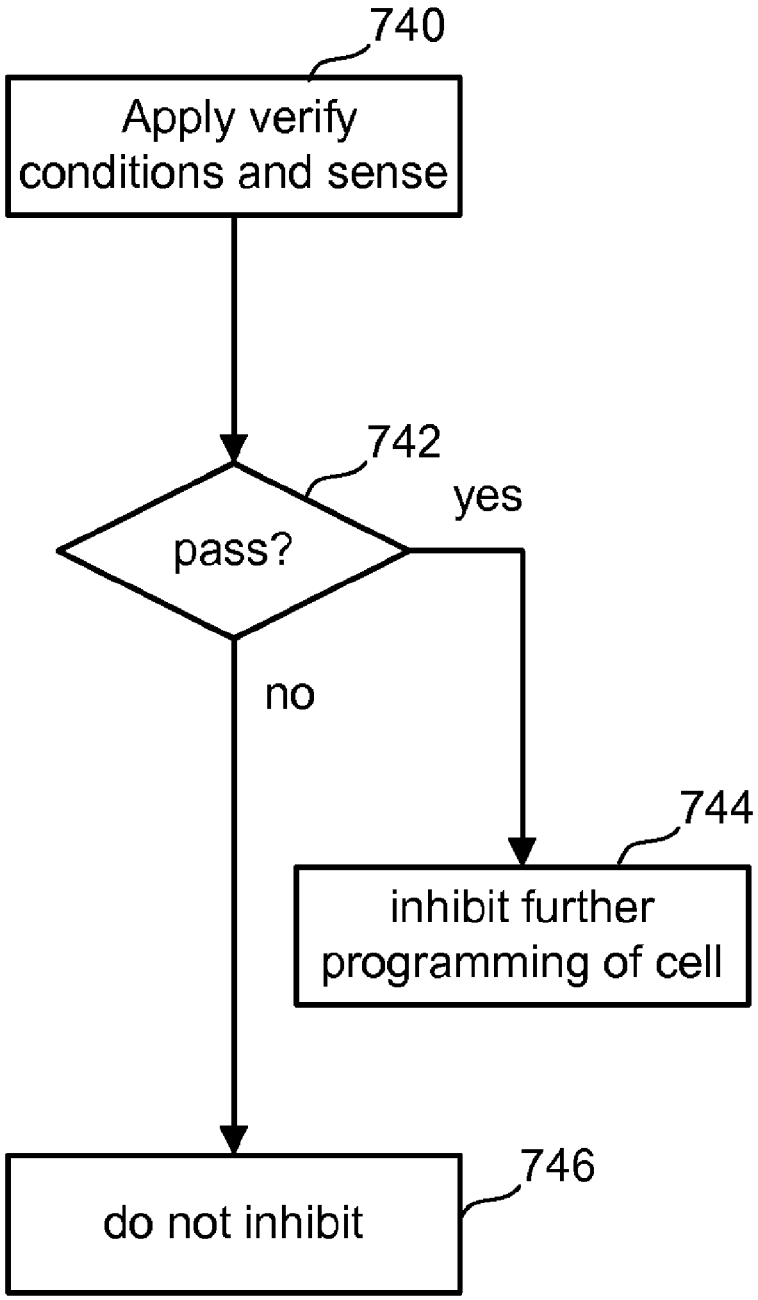
FIG. 7B provides a flow chart describing one embodiment of a process of performing verification without coarse/fine programming.

In some embodiments, programming has a coarse mode and a fine mode. In general, a coarse programming mode may attempt to program a memory cell faster when it is further from its target threshold voltage, and program more slowly when the memory cell is closer to its target threshold voltage. However, using both a coarse programming mode and a fine programming mode is not required. The coarse and fine program can also be executed in one program sequence as in FIG. 7B. The verify process in 722 can be done to execute both coarse and fine verify. The program pulse step 720 can also be executed with differentiation of fast program for coarse and slow program for fine program. First, a verify process will be discussed for the case in which coarse/fine programming is not used. FIG. 7B provides a flow chart describing one embodiment of a process of performing verification without coarse/fine programming (see step 722 of FIG. 7A). The process describes verification of a single memory cell. The process may be performed concurrently on many memory cells.

Verify conditions are applied and sensing is performed in step 740. For example, looking at FIG. 6A, if the A-state is being verified, then the threshold voltage of the memory cell can be compared to the final target threshold voltage for the A-state VvA. Further details of step 740 are discussed below. If the memory cell's threshold voltage is greater than the target voltage VvA (step 742), then the verification test has passed and the memory cell will be inhibited from programming in step 744. One embodiment for inhibiting a memory cell from further programming is to raise the bit line to Vdd, which causes the NAND chain channel to be cut off from the bitline bias. A high voltage may be formed in the isolated channel as the wordline voltage rises to high voltage due to coupling when the program pulse is applied. Other means for inhibiting a memory cell from further programming can also be used. If, in step 742, it is determined that the verification test did not pass (e.g., because the threshold voltage of the memory cell is less than target voltage VvA), then the memory cell will not be inhibited from further programming (step 746).

Figure 7C:
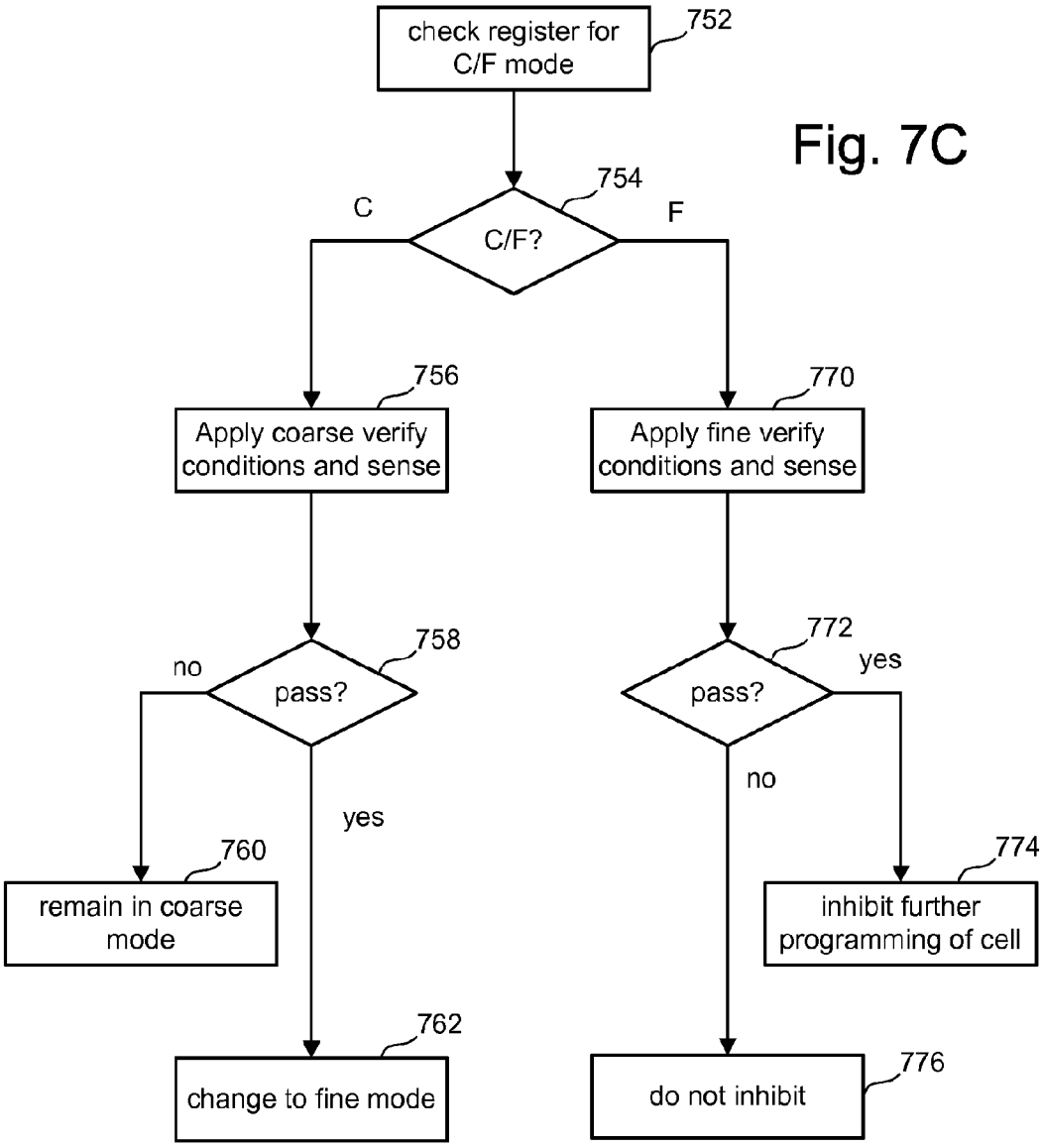
FIG. 7C provides a flow chart describing one embodiment of a process of verifying in which coarse/fine programming is used.

FIG. 7C provides a flow chart describing one embodiment of a process of verifying in which coarse/fine programming is used. The process performs coarse and fine verification. The process describes verification of a single memory cell. The process may be performed concurrently on many memory cells. In step 752, the system will check a register (or other storage device) to determine whether the particular memory cell is in a coarse programming mode or a fine programming mode. If the memory cell is in the coarse programming mode (step 754), then a coarse verification is performed in step 756. For example, referring to FIG. 6C, if the A-state is being verified, then the memory cell could have its threshold voltage compared to voltage VvaL. Further details of step 756 are discussed below. If the threshold voltage of the memory cell is above VvaL (step 758), then the memory cell has passed the coarse verification test. If the threshold voltage of the memory cell is less VvaL, then the memory cell has not passed the verification test. If the memory cell has not passed the coarse verification test, then the memory cell remains in the coarse programming mode (step 760). If the memory cell passes the coarse verification test, the memory cell will change programming modes to the fine programming mode (step 762). Note that the programming mode can be changed in a different program pass or changed in the same program pass. One program pass is described in FIG. 7A from step 702 to step 726 or 730. Applying coarse verify and fine verify can be done together regardless of whether bits pass the coarse Vt target VvaL or the fine Vt target VvA.

If, in step 754, it is determined that the memory cell was in the fine programming mode, then a fine verification conditions are applied and sensing will be performed in step 770. For example, looking at FIG. 6C, the threshold voltage of the memory cell can be compared to the final target threshold voltage VvA. Further details of step 754 are discussed below. If the memory cell's threshold voltage is greater than the target voltage VvA (step 772), then the fine verification test has passed and the memory cell will be inhibited from programming in step 774. One embodiment for inhibiting a memory cell from further programming is to raise the bit line to Vdd, at least when the program pulse is applied. Other means for inhibiting a memory cell from further programming can also be used. If, in step 772, it is determined that the verification test did not pass (e.g., because the threshold voltage of the memory cell is less than target voltage VvA), then the memory cell will not be inhibited from further programming (step 776). In some embodiments, even after the memory cell is inhibited from further programming, its bit line may be charged during verify of step 770. Further details of biasing bit lines during verify are discussed below.

Figure 7D:
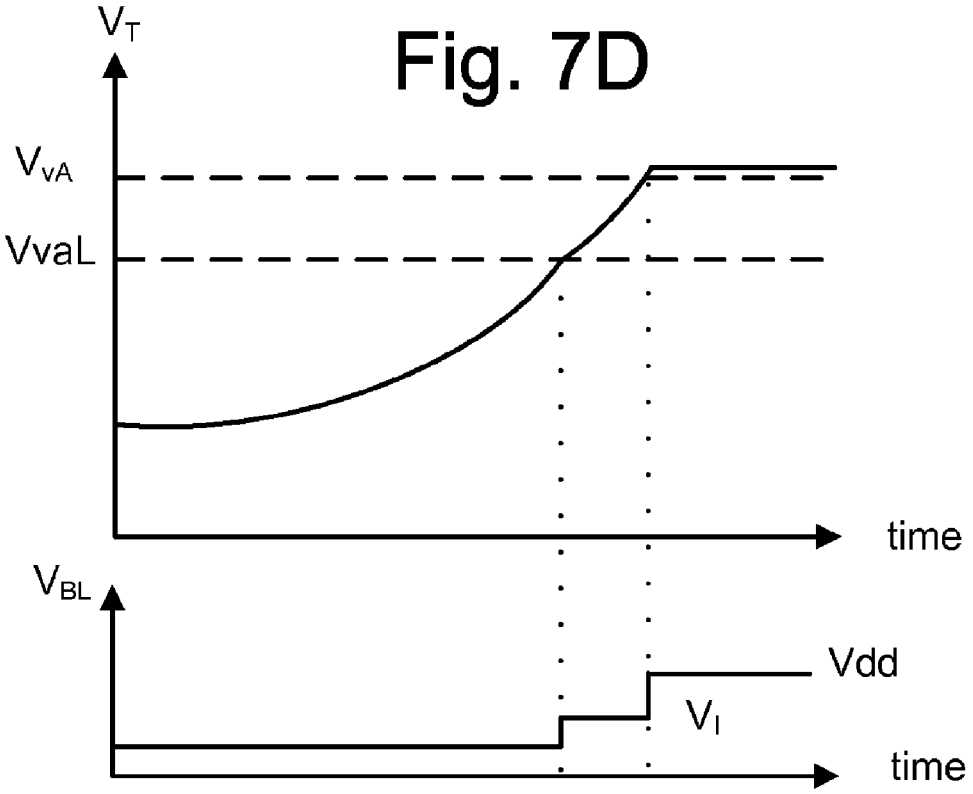
FIG. 7D provides graphs of threshold voltage ($V_T$) versus time and bit line voltage ($V_{BL}$) versus time to indicate how one example of a coarse/fine programming process is performed.

FIG. 7D provides graphs of threshold voltage ($V_T$) versus time and bit line voltage ($V_{BL}$) versus time in a program pulse to indicate how one example of a coarse/fine programming process is performed. Threshold voltage levels for verifying the A-state are depicted (VvaL and VvA). Other levels may be used for verifying other states. Various alternatives and embodiments of the coarse/fine programming methodology can also be used. The signals in the graphs begin with the coarse phase of the programming process. Thus, the threshold voltage of the memory cell Vt is relatively low. When the threshold voltage of the memory cell reaches voltage of VvaL, then the memory cell enters a fine programming phase by raising the bit line voltage of the cell to a value of $V_I$ in order to slow down the programming. During the fine programming phase, programming is slowed, as compared to the coarse programming phase. Therefore, the change in threshold voltage per program step is likely to be smaller during the fine programming phase. The memory cell will remain in the fine programming phase until the threshold voltage of the memory cell has reached the target threshold voltage level of VvA. When the threshold voltage of the memory cell reaches VvA, the memory cell's bit line voltage may be raised to Vdd to inhibit further programming of that cell. In one embodiment, VvaL is one $V_{pgm}$ step size below VvA. In other embodiments, the difference between VvaL and VvA is smaller or greater. Note that FIG. 7D depicts bit line voltages when program pulses are applied, as opposed to the bit line voltages during verify. Bit line voltages during verify are further discussed below.

Figure 8A:
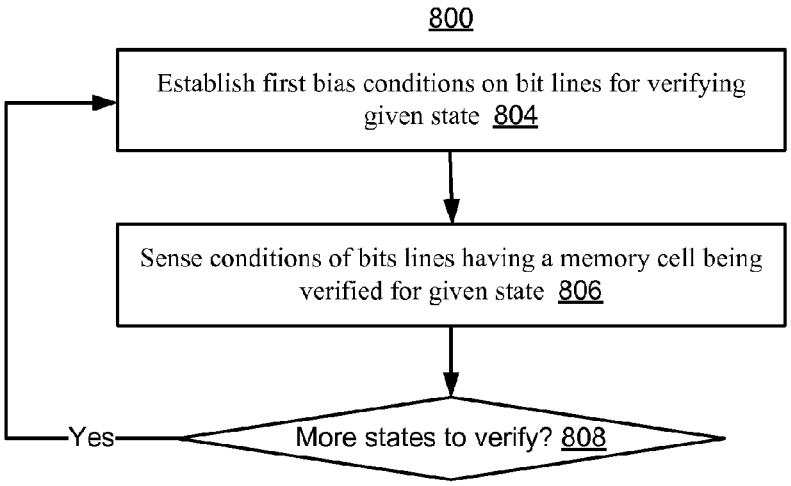
FIG. 8A is flowchart of one embodiment of a process for verifying memory cells during a programming process.
Figure 8B:
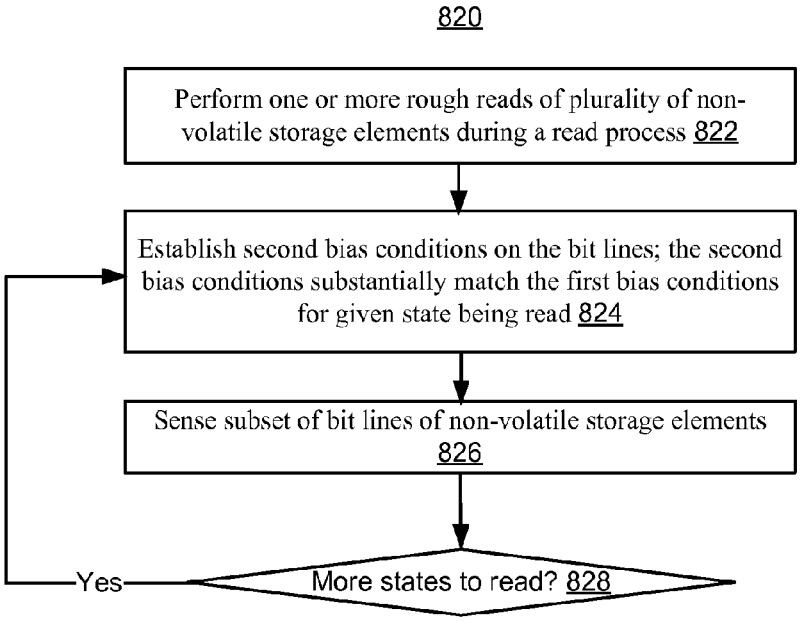
FIG. 8B depicts a flowchart of one embodiment of a process for reading memory cells.

FIG. 8A is flowchart of one embodiment of a process 800 for verifying memory cells during a programming process. When verifying the memory cells, certain bias conditions are applied to the bit lines. For example, some bit lines are precharged and other are grounded. In one embodiment, the biasing of the bit lines depends on the state to which each memory cell is being programmed to (or already has been programmed to). FIG. 8B depicts a flowchart of one embodiment of a process 820 for reading memory cells. When reading a particular state, the bit lines are biased in way that substantially matches the bit line biasing used during verify of that state. Therefore, the channel potential of most of the memory cells that neighbor the memory cells being read matches the channel potential of the neighbor memory cell during verify of that state. This reduces or eliminates channel coupling effects.

Process 800 of FIG. 8A may be used during verify step 740 of FIG. 7B, coarse verify step 756 of FIG. 7C or fine verify step 770 of FIG. 770. Note for some embodiments, process 800 is used for the fine verify step 770 of FIG. 7C, but is not used for the coarse verify step 756 of FIG. 7C. Also, note that process 800 is not required to be performed for every iteration of the programming process. Therefore, process 800 does not need to be performed for each verify operation. For example, process 800 is not required to be used for every iteration of step 740 of FIG. 7B. Therefore, it is not an absolute requirement that the neighbor's channel potential during verify of every iteration of programming process 700 of FIG. 7A match the neighbor's channel potential during read. In one embodiment, process 800 is used at least the final time that a given memory cell is being verified.

Note that process 800 repeats once for each state that is being verified. Thus, with each iteration a different state may be verified. For example, those memory cells that are being programmed to the A-state have their threshold voltage compared to VvA during a certain iteration. In step 804, first bias conditions for verifying a given state are established on bit lines. The term "first bias conditions" is used herein to refer to the bit line bias conditions used during verify. The term "second bias conditions" will be used herein to refer to the bit line bias conditions used during read. A separate set of first bias conditions may be established when verifying each programmed state. Biasing a bit line may be based on the state to which a non-volatile storage elements on the bit line is being programmed.

In one embodiment, a first voltage is applied to a first group of bit lines that contain at least those bits lines having a memory cell that is being programmed to the state being verified. The first group may include bit lines that have memory cells not being programmed to the state being verified. In one embodiment, the first group of non-volatile storage elements have a first channel potential during the verify operation. In one embodiment, all bit lines of memory cells that are not in the first group are in a second group. The second group of bit lines may include at least some bit lines that have a non-volatile storage element that is to be programmed to a programmed state other than the state being verified. The second group of memory cells may be grounded. By grounding the bit lines power may be saved. Also, the peak current may be reduced.

In step 806, a condition of each bit line having a memory cell being verified is tested in order to verify whether each memory cell is programmed to the given programmed state. For example, a sense amplifier may measure the bit line current in order to measure the conduction current of the selected memory cell on that bit line after the first bias conditions are established. Note that only those bit lines having a memory cell being verified need to be tested. The first bias conditions may impact the channel potential of the memory cells that are neighbors to the ones being verified. For example, the neighbor's bit line might be either charged to some voltage or grounded. In one embodiment, the neighbor's bit line might be either charged to 0.4 volts or grounded. However, other voltages could be used. As already noted, the bit line biasing may depend on the state to which the memory cell on that bit line is being (or already has been) programmed. As one example, if the neighbor memory cell is being programmed to (or has already been programmed to) either the state presently being verified or the state below the state presently being verified, then the neighbor's bit line may be pre-charged. Otherwise, the neighbor's bit line may be grounded. Therefore, non-volatile storage elements that are neighbors of non-volatile storage elements being programmed to a given state may have a channel potential during verify of the given state that depends on the state to which the neighbor non-volatile storage element was programmed or is being programmed. Many other bit line biasing schemes are possible including, but not limited to, those discussed below.

If there are more states to verify (step 808), then step 804 may be performed again to establish another set of first bias conditions. However, this time the first bias conditions are for the next state being verified. Note that these bit line bias conditions may be different from the previous ones. Therefore, the first bias conditions may depend on the state that is being verified. Once all states have been verified, process 800 concludes. After performing process 800, a step may be performed for each bit line to determine whether verification passed on an individual memory cell basis. For example, one of steps 742 of FIG. 7B, 758 or 770 of FIG. 7C may be performed. After completing the process of FIG. 7B or 7C, step 724 of FIG. 7A may be performed to determine whether all memory cells have passed verify. If not, then one or more additional program pulses may be applied in step 720 of FIG. 7A. Eventually, programming completes with memory cells verified.

At some later point in time, the programmed memory cells may be read to access the stored data. The process 820 of FIG. 8B may be performed to read the memory cells. As mentioned, the term "second bias conditions" will be used to refer to bit line bias conditions during read. Process 820 may substantially match the second bit line bias conditions to the first line bias conditions. Therefore, the channel potential that most of the neighbor memory cell's have during read of a target memory cell may be matched to the channel potential that the neighbor's had during verify. This reduces or eliminates differences in channel coupling effects between verify and read. Note that it is not a requirement that all neighbor memory cells have the same channel potential during verify and read.

In step 822, at least one rough read of the non-volatile storage elements associated with the selected word line is performed during a read process. Note that when performing the rough read, the bit line conditions are not necessarily matched to the first bit line conditions used during verify. For example, in some embodiments, all bit lines are charged to some voltage when performing the rough read. Also note that while step 822 is depicted as occurring prior to other steps as a matter of convenience of explanation, one or more rough reads may occur at other points in process 820. Further details of performing rough reads are discussed below.

Steps 824-828 form a loop that is repeated once for each state being read during the read process. For example, referring to FIG. 6C, one iteration may be performed for each read voltage VrA-VrC. Note that the term "reading a state" is used herein to refer to determining whether a memory cell has a threshold voltage of at least a voltage level associated with the state (such as VrA). To finally determine whether a memory cell is actually in the A-state, the memory cell's threshold voltage should be compared to VrB also.

In step 824, second bias conditions are established for the present state being read=during the read process. A separate set of second bias conditions nay established for each state being read during the read process. The second bias conditions for a given state may substantially match the first bit line bias conditions used during verify of the given state. For example, if the A-state is being read, then the second bit line bias conditions may substantially match the first bit line bias conditions used when verifying the A-state. In some embodiments, the second set of bias conditions are based on the one or more rough reads of step 822. As already mentioned, verifying may be performed multiple times for a given memory cell. In some embodiments, the second bit line bias conditions substantially match the first bit line bias conditions used for at least the final time a memory cell is verified. Note that establishing the second bias conditions when reading a given state may cause substantially all non-volatile storage elements that are neighbors of non-volatile storage elements that were programmed to the given state to have a channel potential that matches the channel potential of the neighbor when verifying the given state.

In some embodiments, data from the rough reads is used to determine what voltage should be applied to each bit line. For example, the second bias conditions may be based on what state the rough reads indicate that the selected memory cell on a bit line was programmed to. In some embodiments, the rough read itself may help to establish the second bit line bias. For example, the rough read may discharge a bit line to establish the bit line potential at a desired level. In some embodiments, establishing the second bias conditions includes pre-charging a first group of bit lines to a certain voltage and grounding a second group of bit lines.

In step 826, bit lines are sensed after establishing the second bias conditions during the read process. Note that not all bit lines need to be sensed. In one embodiments, bit lines that were pre-charged are sensed and those that were grounded are not. Sensing the bit lines determines whether the memory cell on the bit line has a threshold voltage above or below the voltage level for the state being read. For example, when reading the A-state, the sensing determines whether the memory cell has a Vt above or below VrA.

Note that there may not be an exact correspondence between the bit lines that had the voltage applied during verify of the present state and those that had the voltage applied during read of the present state. Also note that there may not be an exact correspondence between the bit lines that were grounded during verify and those that were grounded during read. However, no bit line having a memory cell being either verified or read should be grounded. Even if there is not an exact correspondence between bit line voltages during verify and read, for most memory cells the neighboring bit lines should be at the same potential during read and verify. Therefore, the channel potential of the neighbors of most of the target memory cells being read should be the same during verify and read. Consequently, differences in channel coupling effects between verify and read are mitigated.

Figure 9A:
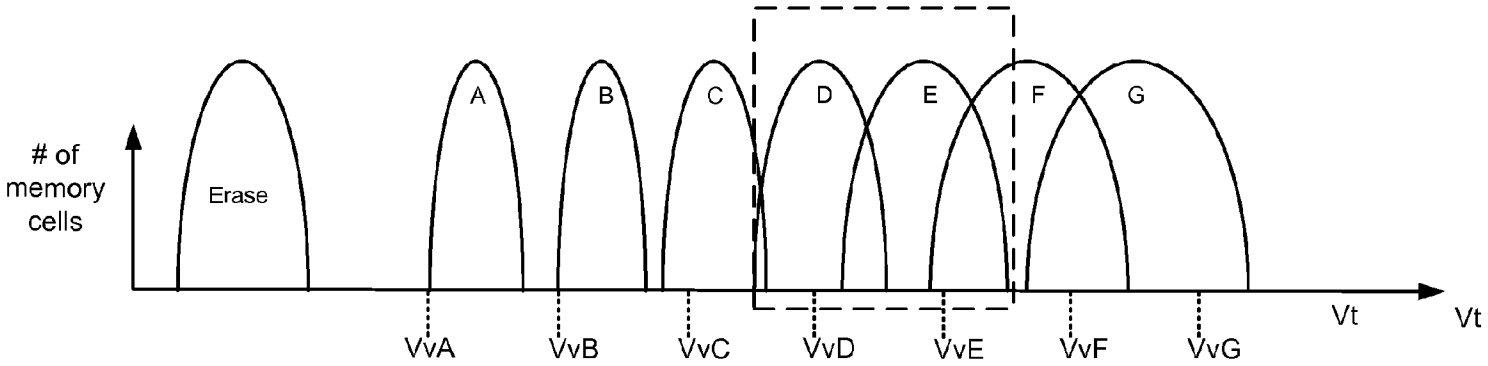
FIG. 9A depicts an example of threshold voltage distributions during programming.

The term "first group of memory cells" will be used to refer to those that had their bit lines charged during one embodiment of verify. In one embodiment, the first group of memory cells during verify are those that are being programmed to the state being verified and those memory cells being programming to the state immediately below the state being verified. FIG. 9A depicts an example of threshold voltage distributions during programming. There are eight different threshold distribution curves in FIG. 9A. Each curve corresponds to one of the data states (e.g., erase state and programmed states A-G). Verify voltages VvA-VvG are depicted on the Vt axis. Note that programming is complete for some of the lower states. For example, all memory cells being programmed to the A-state are above VvA and all memory cells being programmed to the B-state are above VvB. However, for the other states at least some of the memory cells are still below the corresponding verify level.

FIG. 9A shows a dashed box to represent that memory cells being programmed to either the D- or E-state have their bit lines charged during verify of the E-state. However, bit lines for memory cells being programmed to any other state are grounded when verifying the E-state in this embodiment. Note that memory cells being programmed to either the C- or F-state do not have their bit lines charged during verify of the E-state.

Figure 9B:
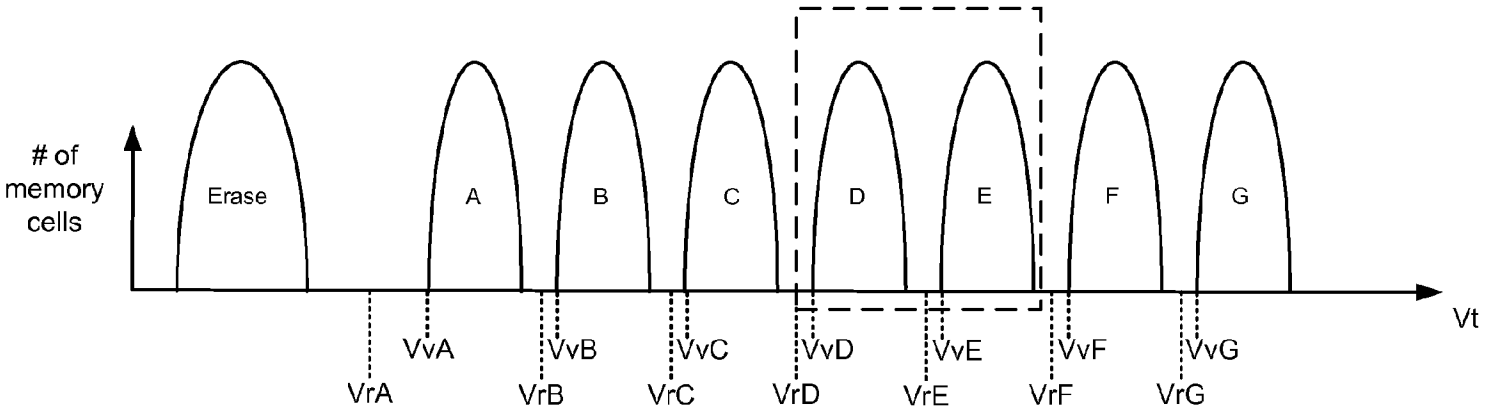
FIG. 9B depicts an example of threshold voltage distributions after programming is complete.

FIG. 9B depicts an example of threshold voltage distributions after programming is complete. The read reference voltages Vra-VrG are depicted on the Vt axis. When reading the E-state, first a rough read is performed to roughly determine which memory cells have a Vt between VrD and VrF. The read roughly determines which memory cells are in either the D-state or the E-state. Then, a fine read is performed in which the bit lines for those memory cells that were roughly determined to be in either the D-state or the E-state are charged up. However, bit lines for other memory cells are grounded. Therefore, the neighbor's channel potential for memory cells being read should match what the neighbor's channel potential was during verify.

Figure 10A:
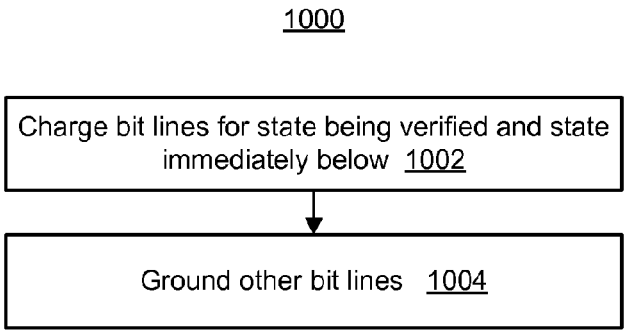
FIG. 10A is a flowchart of one embodiment of a process for establishing first bias conditions during verify.

FIG. 10A is a flowchart of one embodiment of a process 1000 for establishing first bias conditions during verify. Process 1000 is one embodiment of step 804 of verify process 800. In process 1000, bit lines of memory cells being verified and those in the state immediately below are charged and other bit lines are not charged. Thus, process 1000 may use the scheme depicted in FIG. 9A. In step 1002, bit lines memory cells being verified and those in the state immediately below are charged. For example, bit lines of memory cells being programmed to the A-state and those to stay erased are charged. The bit lines may be charged to a suitable level to allow the threshold voltage of memory cells to be compared to VvA. In step 1004, other bit lines are grounded.

After establishing the bit line bias conditions, memory cells being programmed to the state being verified are sensed to determine if their Vt is at the verify level, as described in step 806 of process 800. For example, memory cells being programmed to the A-state are sensed. Memory cells that reach the verify level may be locked out from further programming. Process 1000 may then be repeated to verify another state. For example, when the B-state is being verified, bit lines of memory cells being programmed to the B-state and those programmed to the A-state are charged. Other bit lines are grounded in step 1004.

Figure 10B:
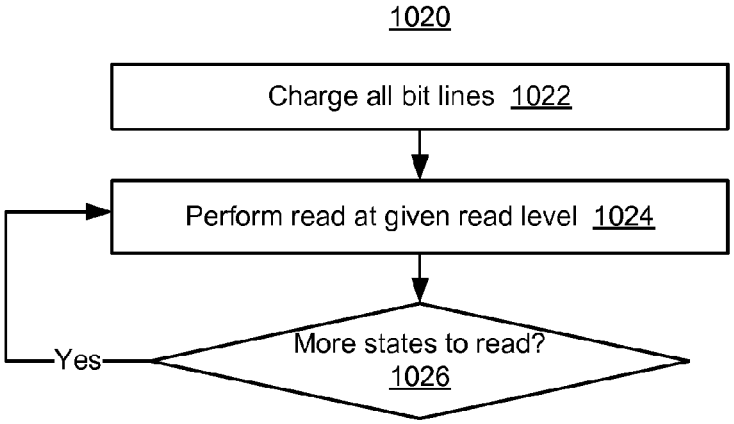
FIG. 10B is a flowchart of one embodiment of a process for performing rough reads.
Figure 10C:
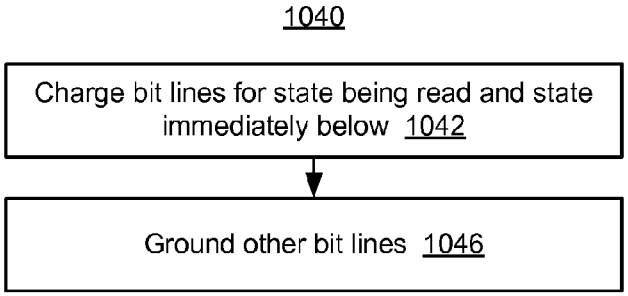
FIG. 10C is a flowchart of one embodiment of a process for establishing second bit line bias conditions based on rough reads.

FIG. 10B is a flowchart of one embodiment of a process 1020 for performing rough reads. In this embodiment, the rough reads are used to roughly determine what state each memory cells is in. This may be referred to as a rough read because later the reading will be refined based on information learned from the rough read. For example, the information will be used to determine which bit lines to charge when reading at each state. Process 1020 describes one embodiment of step 822 from process 820. FIG. 10C is a flowchart of one embodiment of a process 1040 for establishing second bit line bias conditions based on rough reads. Process 1040 describes one embodiment of step 824 from process 820. Processes 1020 and 1040 are typically used together when reading memory cells and may be used if process 1000 of FIG. 10A was used to verify the memory cells during programming.

In step 1022 of FIG. 10B, all bit lines are pre-charged to a voltage that is suitable to sense the memory cells. For example, 0.4 volts may be applied to all bit lines. In step 1024 of FIG. 10B, a read of the memory cells is performed at given level. For example, a read is performed to determine which memory cells have a Vt above VrA. To perform the read, the voltage of VrA may be applied to the selected word line. Then, a conduction current of each bit line may be sensed. Results of the sensing operation may be stored in a latch or other storage unit. In one embodiment, the reading is "all bit line" ("ABL") reading. In ABL reading, both the even and odd bit lines are sensed together. However, ABL sensing is not a requirement. For example, the even and odd bit lines may be read separately. Further details of one embodiment reading memory cells are discussed below.

If there are more states to read, the process 1020 returns to step 1022 to read the next state. In one embodiment, the reading proceeds from the A-state upwards. In some embodiments, reading causes bit lines that have memory cells with a Vt below the read compare level to discharge. For example, reading at VrA may cause the bit lines of erased memory cells to discharge. However, bit lines of other memory cells may not discharge as a result of the read. Therefore, the bit lines may not need to be re-charged again if reading proceeds from the A-state upwards. However, reading is not required to be performed in any specific order. Moreover, reading is not required to be performed in a way that prevents certain bit lines from discharging. After all states have been read, the process 1020 concludes.

After completion of process 1020, process 1040 of FIG. 10C may be performed. As mentioned, process 1040 establishes the second bias conditions on the bit lines for reading a certain state. Recall that a different set of second bias conditions may be established for each state that is read. In step 1024 of FIG. 10C bit lines for a state being read and the state immediately below are charged. For example, based on the information from the rough read of process 1020, bit lines of memory cells roughly determined to be in the A-state and the erased state are charged. All other bit line may be grounded in step 1046. The foregoing assumes that the A-state is presently being read. Therefore, the bit line bias conditions may closely match the bit line bias conditions that were applied when verifying the A-state.

After establishing the bit line bias conditions, step 826 of FIG. 8B may performed for the present state being read. For example, an appropriate read voltage may be applied to the selected word line to test whether memory cells have a Vt above/below VrA. Then, process 1040 may be repeated to establish the second bit line conditions for another state. For example, if the B-state is the next to be read, then bit lines of memory cells that were roughly determined to be programmed to the B-state and those roughly determined to be programmed to the A-state may be charged. Note that process 1020 of roughly reading all of the states does not need to be performed again. Instead, data that was previously read may be used.

Figure 11A:
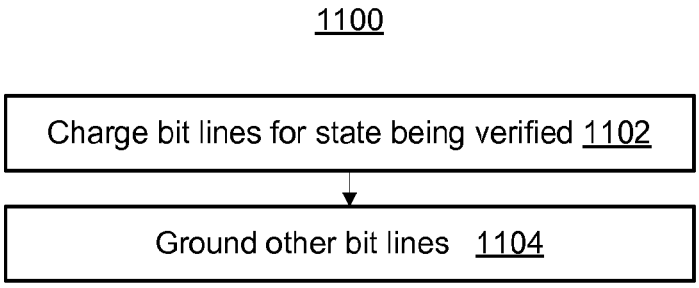
FIG. 11A is a flowchart of one embodiment of a process for establishing first bias conditions during verify.

FIG. 11A is a flowchart of one embodiment of a process 1100 for establishing first bias conditions during verify. Process 1100 is one embodiment of step 804 of verify process 800. In process 1100, bit lines of memory cells being verified are charged and other bit lines are not charged. In step 1102, bit lines memory cells being verified are charged. For example, bit lines of memory cells being programmed to the A-state are charged. The bit lines may be charged to a suitable level to allow the threshold voltage of memory cells to be compared to VvA. In step 1104, all other bit lines may be grounded.

After establishing the bit line bias conditions in process 1100, memory cells being programmed to the state being verified are sensed to determine if their Vt is at the verify level, as described in step 806 of process 800. For example, memory cells being programmed to the A-state are sensed. Memory cells that reach the verify level may be locked out from further programming. Thus, when the B-state is being verified, memory cells being programmed to the B-state may be charged and all other bit lines may be grounded. Process 1100 may be repeated for each state that is verified.

Figure 11B:
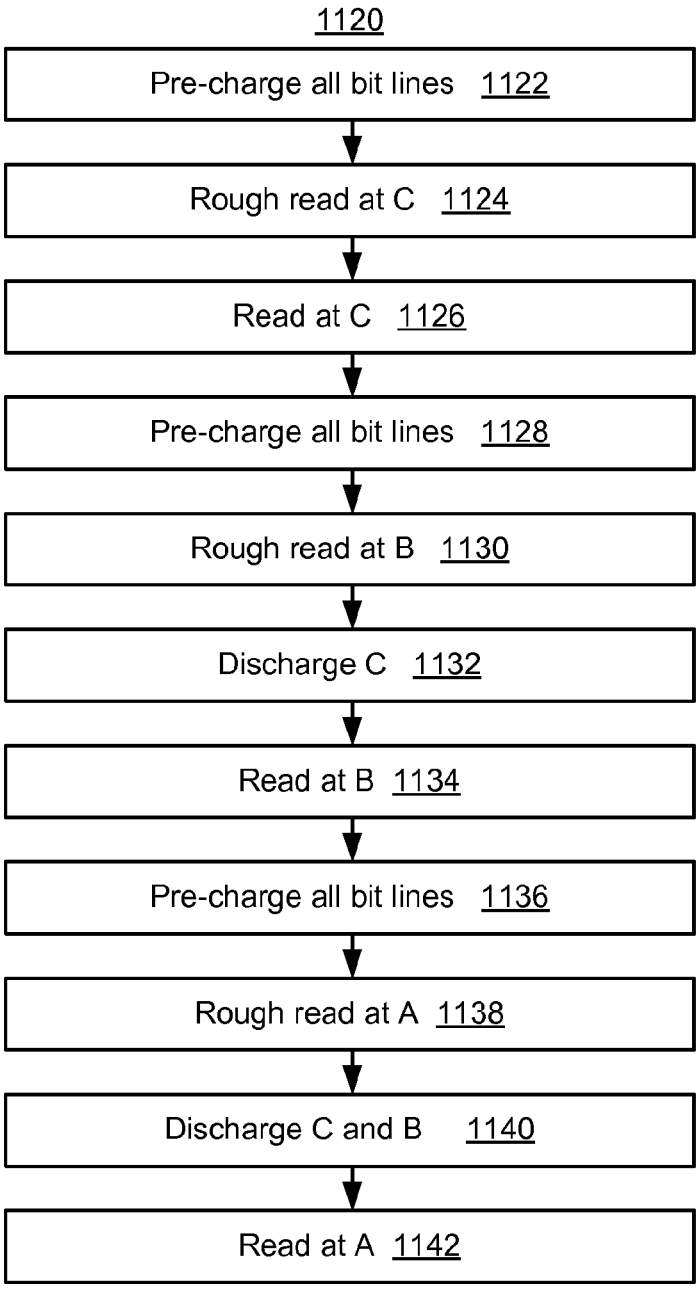
FIG. 11B is a flowchart of one embodiment of a process for reading memory cells.

FIG. 11B is a flowchart of one embodiment of a process 1120 for reading memory cells. Process 1120 describes one embodiment of steps 822-828 from process 820 of FIG. 8B. Process 1120 may be used when process 1100 was used when verifying memory cells in order to mitigate effects of channel coupling. Process 1120 describes an embodiment with four states: erase, A, B, and C. However, the process 1120 may be extended to more or fewer states. In general, the process 1120 involves reading states in an order from highest state to lowest state. For example, the C-state is read, then the B-state, then the A-state.

In step 1122, all bit lines are pre-charged. Note that charging all bit lines is not required. However, charging all bit lines allows all bit lines (odd and even) to be read together, which saves time.

In step 1124, a rough read at the C-state is performed. Performing the rough read at the C-state may discharge the bit lines of memory cells that are in any state below the C-state. For example, memory cells having a threshold level that is less than the read level for the C-state (e.g., VrC) may conduct a large current, whereas memory cells having a threshold level that is greater than VrC will conduct only a very small current or no current. A large conduction current may discharge the bit line. Alternatively, bit lines with large conduction currents may be detected and shut down by, for example, grounding those bit lines. However, bit lines for memory cells in the C-state should not be discharged. Therefore, after the rough read, only the bit lines of memory cells that are programmed to the C-state remain charged. The rough read at the C-state therefore establishes the second bit line conditions. Note that the second bit line conditions match the first bit line conditions that were established during the verify of the C-state when using the process 1100 of FIG. 11A. Thus, steps 1122 and 1124 are one embodiment of step 824 of establishing second bit line conditions.

Note that it is not required that the rough read at the C-state save the results of the read. Therefore, it is not required to determine which memory cells have a Vt above VrC. In one embodiment, the rough read is a first strobe of a two-strobe read. Further details of one embodiment of a two-strobe read are discussed below. In one embodiment, the rough read includes all but the final strobe of a multi-strobe read.

In step 1124, another read is performed at the C-state. For example, a read is performed at VrC. For example, the voltage VrC is applied to the selected word line after the second bit line conditions were established. Step 1124 determines which memory cells have a threshold voltage of at least VrC. Because the C-state is the highest state in this example, the memory cells that are in the C-state are thus determined. In one embodiment, the read of step 1124 is the second strobe of the two-strobe read used in step 1122. In one embodiment, the read of step 1124 is the final strobe of the multi-strobe read used in step 1122.

In step 1128, all of the bit lines may be charged again. In step 1130, a rough read at the B-state is performed. Performing the rough read at the B-state may discharge the bit lines of memory cells that are in any state below the B-state. For example, memory cells having a threshold level that is less than the read level for the B-state (e.g., VrB) will conduct a large current, whereas memory cells having a threshold level that is greater than VrB will not conduct a large current. Therefore, after the rough read at the B-state, only the bit lines of memory cells that are programmed to either the B- or C-state remain charged.

In step 1132, the bit lines of memory cells that were determined to be in the C-state are discharged. The second bit line conditions are thus established by performing the rough read at B and the discharge of C-state bit lines. Again, note that the second bit line conditions match the first bit line conditions that were established during the verify of the B-state when using the process 1100 of FIG. 11A. Thus, steps 1128, 1130, and 1132 are one embodiment of step 824 of establishing second bit line conditions. In one embodiment, steps 1130 and 1132 are reversed such that the bit lines of C-state memory cells are discharged prior to performing the rough read at the B-state. In one embodiment, rather than pre-charging all bit lines in step 1128, the bit lines with C-state memory cells are not discharged such that step 1132 is not necessary.

In step 1134, another read is performed at the B-state. For example, a read is performed at VrB. For example, the voltage VrB is applied to the selected word line after the second bit line conditions were established. Step 1134 determines which memory cells have a threshold voltage of at least VrB. Because the C-state memory cells were already determined, step 1134 determines which memory cells in the B-state. In one embodiment, the rough read at the B-state and the second read correspond to a first and second strobe of a two-strobe read. However, the rough read and second read are not required to be part of the same two-strobe read operation. Moreover, a two-strobe read is not a requirement of either read.

In step 1136, all of the bit lines may be charged again. In step 1138, a rough read at the A-state is performed. Performing the rough read at the A-state may discharge the bit lines of memory cells that are in any state below the A-state. For example, memory cells having a threshold level that is less than the read level for the A-state (e.g., VrA) will conduct a large current, whereas memory cells having a threshold level that is greater than VrA will not conduct a large current. Therefore, after the rough read at the A-state, only the bit lines of memory cells that are programmed to either the A-, B-, or C-state remain charged.

In step 1140, the bit lines of memory cells that were determined to be in either the B- or C-state are discharged. The second bit line conditions are thus established by performing the rough read at the A-state and the discharge of B- and C-state bit lines. Again, note that the second bit line conditions match the first bit line conditions that were established during the verify of the A-state when using the process 1100 of FIG. 11A. Thus, steps 1136, 1138, and 1140 are one embodiment of step 824 of establishing second bit line conditions. In one embodiment, steps 1138 and 1140 are reversed such that the bit lines of B- and C-state memory cells are discharged prior to performing the rough read at the A-state. In one embodiment, rather than pre-charging all bit lines in step 1128, the bit lines with B- and C-state memory cells are not discharged such that step 1140 is not necessary.

In step 1142, another read is performed at the A-state. For example, a read is performed at VrA. For example, the voltage VrA is applied to the selected word line after the second bit line conditions were established. Step 1142 determines which memory cells have a threshold voltage of at least VrA. Because the B- and C-state memory cells were already determined, step 1142 determines which memory cells in the A-state. Remaining memory cells are thus determined to be in the erased state. In one embodiment, the rough read at the A-state and the second read at the A-state correspond to a first and second strobe of a two-strobe read. However, the rough read and second read are not required to be part of the same two-strobe read operation. Moreover, a two-strobe read is not a requirement of either read.

In some embodiments, not all of the bits stored in the multi-bit memory cells are read back. For example, if two-bits are stored per memory cell, one option is to read back only the first bit or only the second bit. This may be referred to as reading only the lower page or reading only the upper page. In one embodiment that uses the scheme of FIGS. 11A and 11B, reading only the lower page may be accomplished by reading the B-state. Note that when reading the B-state, only the bit lines of memory cells in the B-state should be charged in order to match the first bit line conditions used during verify of FIG. 11A. Therefore, first a rough read at the B-state may be performed to discharge bit lines of memory cells in either the erase or A-state and to determine which bit lines have memory cells below the B-state. Then, a rough read at the C-state may be performed to determine which bit line have memory cells in the C-state. Then, only the bit lines of memory cells that are roughly determined to be in the B-state are charged and a fine read of the B-state is performed. The fine read of the B-state determines which memory cells are in either the B-state or the C-state, which is the lower data page in one embodiment.

Figure 12A:
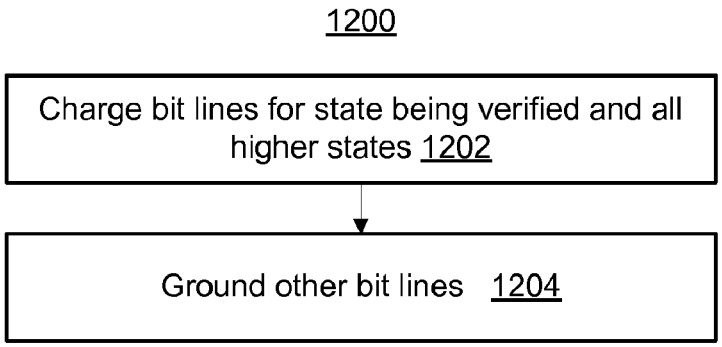
FIG. 12A is a flowchart of one embodiment of a process for establishing first bias conditions during verify.

FIG. 12A is a flowchart of one embodiment of a process 1200 for establishing first bias conditions during verify. Process 1200 is one embodiment of step 804 of verify process 800. In process 1200, bit lines of memory cells being programmed to the state being verified and all higher states are charged. All other bit lines are not charged. In step 1202, bit lines of memory cells being verified and all higher states and are charged. For example, if the A-state is being verified, then bit lines of memory cells being programmed to the A-, B- and C-states are charged. This assumes that there are four states: erase, A, B, and C. Process 1200 may be modified for more or fewer states. In step 1204, all other bit lines may be grounded. For example, bit lines for memory cells to remain erased are grounded.

Process 1200 may be repeated for each state to be verified. For example, when verifying the B-state, bit lines of memory cells being programmed to the B- and C-states are charged in step 1202. Bit line of memory cells to stay erased and to be programmed to the A-state may be grounded in step 1204.

Figure 12B:
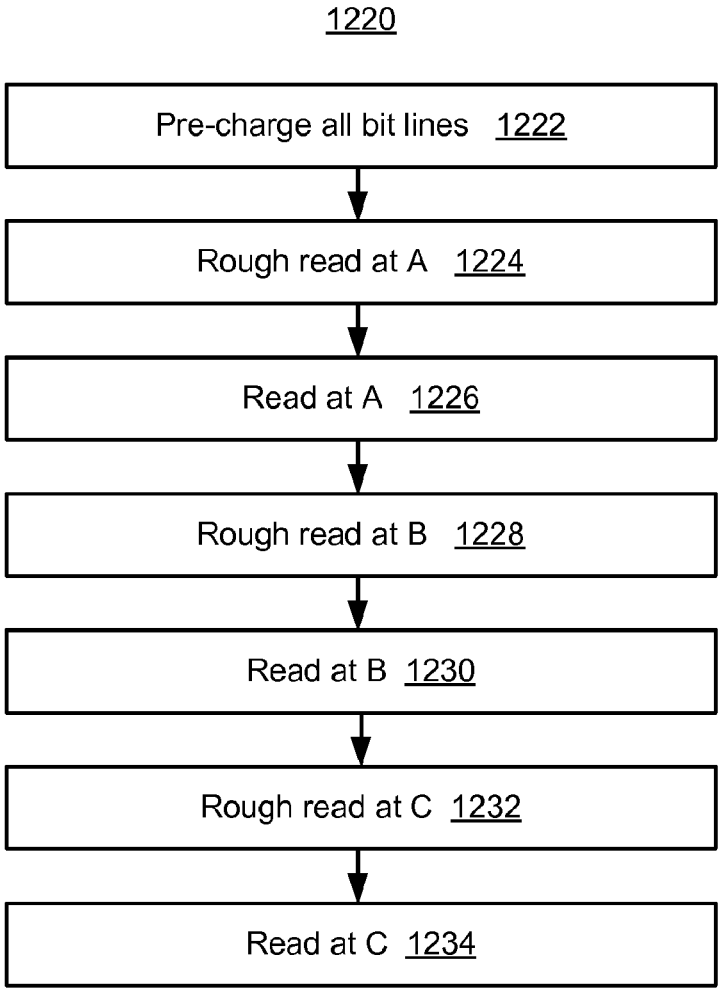
FIG. 12B is a flowchart of one embodiment of a process for performing rough reads and establishing second bit line conditions during read.

FIG. 12B is a flowchart of one embodiment of a process 1220 for performing rough reads and establishing second bit line conditions during read. Process 1220 describes one embodiment of steps 822 and 824 from process 820. Process 1220 may be used when process 1200 was used when verifying memory cells. Process 1220 describes an embodiment with four states: erase, A, B, and C. However, the process 1220 may be extended to more or fewer states. In general, the process 1120 involves reading states in an order from lowest state to highest state. For example, the A-state is read, then the B-state, then the C-state.

In step 1222, all bit lines are pre-charged. In step 1224, a rough read at the A-state is performed. Performing the rough read at the A-state may discharge the bit lines of memory cells that are in any state below the A-state. For example, memory cells having a threshold level that is less than the read level for the A-state (e.g., VrA) will conduct a large current, whereas memory cells having a threshold level that is greater than VrA will not conduct a large current. Therefore, after the rough read at the A-state, only the bit lines of memory cells that are erased will discharge. Note that in some embodiments, bit lines that conduct a large current are identified and shut down by, for example, grounding those bit lines. Also note that these bit line conditions match the first bit line conditions that were established during the verify of the A-state when using the process 1200 of FIG. 12A. That is, the bit lines for memory cells in the A-, B- and C-state are charged, whereas all others are discharged. Thus, the rough read at the A-state establishes the second bit line conditions. Thus, steps 1222 and 1224 are one embodiment of step 824 of establishing second bit line conditions. In one embodiment, the rough read at the A-state is the first strobe of a two-strobe read.

In step 1226, another read is performed at the A-state. For example, a read is performed at VrA. For example, the voltage VrA is applied to the selected word line after the second bit line conditions were established. Step 1226 determines which memory cells have a threshold voltage of at least VrA. Note that some of the memory cells having a threshold voltage of at least VrA could be in either the B- or C-state. Therefore, memory cells in the A-state are not yet determined. In one embodiment, the read of step 1226 is the second strobe of the two-strobe read of step 1224.

In step 1128, a rough read at the B-state is performed. Performing the rough read at the B-state may discharge the bit lines of memory cells that are in any state below the B-state. For example, memory cells having a threshold level that is less than the read level for the B-state (e.g., VrB) will conduct a large current, whereas memory cells having a threshold level that is greater than VrB will not conduct a large current. Therefore, after the rough read at the B-state, only the bit lines of memory cells that are programmed to either the B- or C-state remain charged. In one embodiment, the rough read at the B-state is the first strobe of a two-strobe read.

Note that these bit line conditions match the first bit line conditions that were established during the verify of the B-state when using the process 1200 of FIG. 12A. That is, the bit lines for memory cells in the B- and C-state are charged, whereas all others are discharged. Thus, the rough read at the B-state establishes the second bit line conditions. Thus, step 1222 and 1228 are one embodiment of step 824 of establishing second bit line conditions (for the B-state).

In step 1230, another read is performed at the B-state. For example, a read is performed at VrB. For example, the voltage VrB is applied to the selected word line after the second bit line conditions were established. Step 1230 determines which memory cells have a threshold voltage of at least VrB. Note that memory cells having a threshold voltage of at least VrB could be in either the B- or C-state. Therefore, memory cells in the B-state are not yet determined. However, memory cells that are in the A-state may be determined at this time. In one embodiment, the read of step 1230 is the second strobe of the two-strobe read of step 1228.

In step 1232, a rough read at the C-state is performed. Performing the rough read at the C-state may discharge the bit lines of memory cells that are in any state below the C-state. For example, memory cells having a threshold level that is less than the read level for the C-state (e.g., VrC) will conduct a large current, whereas memory cells having a threshold level that is greater than VrC will not conduct a large current. Therefore, after the rough read at the C-state, only the bit lines of memory cells that are programmed to the C-state remain charged. In one embodiment, the rough read at the C-state is the first strobe of a two-strobe read.

Note that these bit line conditions match the first bit line conditions that were established during the verify of the C-state when using the process 1200 of FIG. 12A. That is, the bit lines for memory cells in the C-state are charged, whereas all others are discharged. Thus, the rough read at the C-state establishes the second bit line conditions (along with the pre-charge in step 1222). Thus, steps 1222 and 1232 are one embodiment of step 824 of establishing second bit line conditions (for the C-state).

In step 1234, another read is performed at the C-state. For example, a read is performed at VrC. For example, the voltage VrC is applied to the selected word line after the second bit line conditions were established. Step 1234 determines which memory cells have a threshold voltage of at least VrC. Based on the reads at various levels, present state of all memory cells can now be determined. In one embodiment, the read of step 1234 is the second strobe of the two-strobe read of step 1232.

In one embodiment, there are at least four latches are used for each bit line during verify. For example, the data latches (FIG. 5, 494) may include two data latches for storing two bits of data to be programmed into the memory cell on the bit line. This assumes that there are four data states. There may be more or fewer than four data states, in which case more or fewer than two data latches may be used. One latch records whether the memory cell is inhibited from further programming. For example, the bit line latch (FIG. 5, 482) may store a value that will result in the connected bit line being pulled to a state designating program inhibit (e.g., Vdd). A quick pass write (QPW) latch may record whether the memory cell is in the QPW mode. Note that it is not required that some latches be located in a common portion 490 and others in a sense module 480, as depicted in FIG. 5.

In some embodiments, there is not a bit line latch 482 to store the indication of whether programming should be inhibited. Rather, after a memory cell has been programmed to its target threshold voltage, the program data in the data latches 494 is overwritten to indicate that programming is complete. For example, after a memory cell has been programmed to its target threshold voltage, the program data in the data latches is set to the values for the erase state. Because no programming needs to be performed for memory cells in the erase state, this may be interpreted as meaning that the memory cell should not receive any further programming.

However, for some embodiments, it is desirable to know what state the memory cell was programmed to in order to properly bias the bit line during verify such that effects of channel coupling may be mitigated during read. That is, even though the memory cell does not need to be verified after it is locked out from further programming, its bit line should still be biased properly during verify in the event that one of its neighbor memory cells still needs to be verified. Some embodiments are able to determine how to bias the bit lines based on the state to which a memory cell was programmed, even if the program data in the data latches 494 has been overwritten. In one embodiment, information from a QPW latch is combined with the present information in the data latches 494 to determine how to bias the bit line during verify. Note that for a memory cell that is to stay erased, the data latches 494 should contain the erase state data throughout the programming process. However, for a memory cell that is to be programmed to a non-erased state, the present information in the data latches 494 may depend on whether the memory cell has reached its intended program state. For example, prior to the memory cell reaching the intended program state, the data latches 494 should contain the original program data. However, after reaching the intended program, the data latches 494 should contain erase state data to indicate programming is complete. Therefore, a data latch with erase state data might be for a memory cell that was to stay erased or for memory cell that has completed programming to a programmed state.

Figure 13:
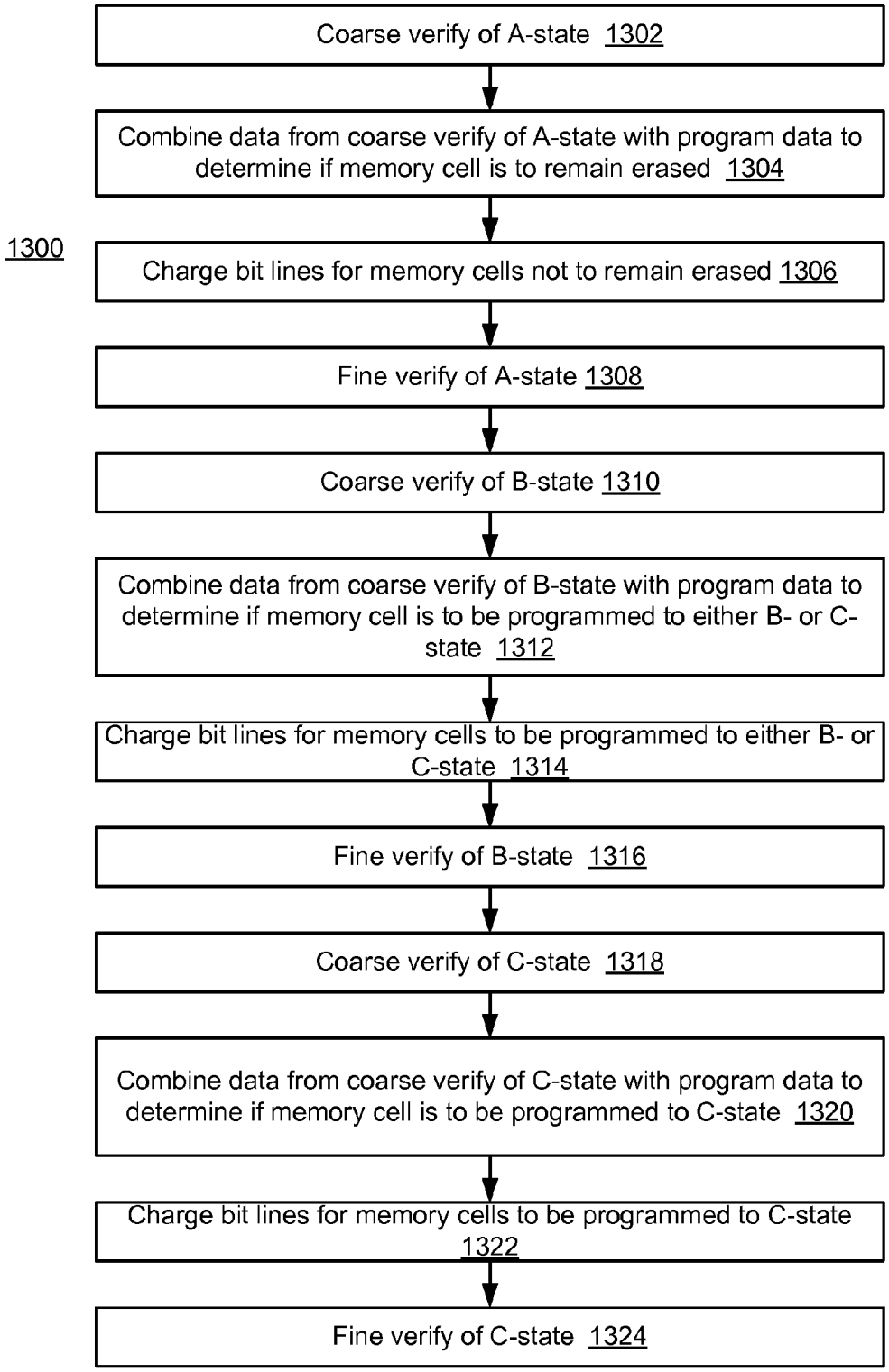
FIG. 13 is a flowchart of one embodiment of a process of verifying memory cells.

FIG. 13 is a flowchart of one embodiment of a process 1300 of verifying memory cells. In process 1300, data from a QPW latch is combined with present data in data latches 494 to decode the original program data then to determine how to bias bit lines during verify. Process 1300 is for an embodiment with four states; however, it will be appreciated that process 1300 may be modified for more or fewer states. Process 1300 uses both a coarse and fine verify. Therefore, process 1300 may be used with coarse and fine programming. Process 1300 describes processing one memory cell. However, it will be appreciated that many memory cells may be verified concurrently. For example, process 1300 may be applied concurrently to all memory cells being programmed.

In step 1302, a coarse verify of the A-state is performed. During the course verify, all bit lines may be charged. Note that it is not required that the bit line bias used during the coarse verify match the bit line bias used during the read of that state. Step 1302 may include sensing bit lines for conduction current and storing a value in a QPW latch based on whether the bit line conducts a significant current. For example, if the threshold voltage of the memory cell is greater than VvaL, then the QPW latch may be set to "1." Step 1302 is one embodiment of steps 756-762 of FIG. 7C.

Note that after step 1302, the data latches for the memory cell may contain the original program data, or the program data may have been set to the erase state to indicate that further programming should be inhibited for the memory cell on that bit line. Therefore, if the data latch indicates a data state other than erase, the data latch indicates the state to which the memory cell is to be programmed. However, if the data latch indicates the erase state, then it is uncertain whether the memory cell was one that was to remain erased or has been programmed to another state and is now inhibited from further programming.

In step 1304, data from the QPW latch is combined with the present data from the data latches 494 to determine whether the data latches 494 contains actual erase data or inhibit data. Table 1400 in FIG. 14A summarizes conditions to illustrate one embodiment of how the QPW latch may be combined with current data from the data latches 494. Each column in Table 1400 in FIG. 14A pertains to a different condition for a given memory cell. The column Er pertains to a memory cell that is to stay in the erased state (hence its Vt is in the erased state). The columns A, B, C refer to "unprogrammed" cases for memory cells being programmed to the A-, B-, and C-state respectively. A memory cell that is unprogrammed may have any Vt that is less than the target Vt for that state. The columns Aq, Bq, Cq refer to "quick pass write" cases for memory cells being programmed to the A-, B-, and C-state respectively. A memory cell that is in the quick pass write stage may have any Vt between the coarse verify and fine verify level. For example, for the A-state the memory cell may be between VvaL and VvA. The columns Ain, Bin, Cin refer to "inhibited" cases for memory cells being programmed to the A-, B-, and C-state respectively. A memory cell that is inhibited has reached its target Vt and has been locked out from further programming. Note that when a memory cell is locked out from programming, the data latch may be set to the erase state to indicate that it should be locked out.

The first row in Table 1400 contains a "1" for the cases in which the data latches will indicate the erase state. As mentioned, this may be due to the memory cell being one that is to stay erased or a memory cell that has reached its target level and has been inhibited from further programming. Therefore, a "1" is shown in the first row in the columns Er (memory cell is to stay erased) and the columns Ain (memory cell is inhibited from further program because it has reached its target A-state), as well as the Bin and Cin columns. The second row in the table shows possible values when performing the coarse verify. For example, if the memory cell is not yet programmed it may have a Vt that is either above or below VvaL. Note that this is true for memory cells being programmed to any state. Therefore, the table indicates the uncertain value of "0/1" for the unprogrammed cases. Table 1400 has a "1" for Aq, Ain, Bq, Bin, Cq and Cin because the Vt will be higher than the VvaL voltage level for those cases.

The third row in the table has a "1" for the cases for which the bit line should be biased when performing the fine A-state verify. In this example, this applies to every case but memory cells that are to stay erased. The third row is formed from a combination of the QPW latch and the data latches 494. In this example, the third row is formed from QPW OR NOT Er. In other words, if either the QPW latch is set to "1" OR if the data latches 494 contain anything other than erase data, then the third row equals "1". For example, for the cases of A, Aq, B, Bq, C, Cq, the data latches 494 do not contain erase data. Therefore, the third row is set to "1" for those values. Also, if the QPW is set to "1", the third row is set. For example, Aq, Ain, Bq, Bin, Cq, and Cin the QPW is set. Therefore, the corresponding boxes in the third row are set. Note that for A, B, and C, the value of QPW is uncertain. However, the third row is set to "1" due to the data latches 494 not containing erase data. Note that combining the QPW latch with the data latch could be performed in other ways.

In step 1306, bit lines for memory cells that are not to remain erased are charged, whereas bit lines for memory cells that are to remain erased are not charged. The correct bit lines were determined in step 1304, as previously discussed.

In step 1308, a fine verify of the A-state is performed with the bit line conditions established in step 1306. For example, a voltage VvA may be applied to the selected word line and then the bit lines may be sensed. Step 1308 is one embodiment of step 770 of FIG. 7C. Therefore, after sensing the bit lines, a determination may be made whether verification passed (step 772, FIG. 7C). If verification passed and the bit line is to be inhibited, then the data latches 494 may be set to the erased state to provide the inhibit indicator (step 774, FIG. 7C).

In step 1310, a coarse verify of the B-state is performed. During the course verify, all bit lines may be charged. Note that it is not required that the bit line bias used during the coarse verify match the bit line bias used during the read of that state. Step 1310 may include sensing bit lines for conduction current and storing a value in a QPW latch based on whether the bit line conducts a significant current. For example, if the threshold voltage of the memory cell is greater than VvaL, then the QPW latch is set to "1." Step 1310 is one embodiment of steps 756-762 of FIG. 7C.

Note that after step 1310, the data latches for the memory cell may contain the original program data, or the program data may have been set to the erase state to indicate that further programming should be inhibited. Therefore, if the data latch indicates a data state other than erase, the data latch indicates the state to which the memory cell is to be programmed. However, if the data latch indicates the erase state it is uncertain whether the memory cell was one that was to remain erased or has been programmed to another state and is now inhibited from further programming.

In step 1312, data from the QPW latch is combined with the current data from the data latches 494 to determine whether the data latches 494 contain actual erase data or inhibit data. For the VerifyB cases, it is desirable to determine which bit lines either have memory cells that were to stay erased or those that were to be programmed to the A-state. Table 1420 of FIG. 14B will be referred to when discussing step 1312. The first row in Table 1420 contains a "1" for the cases in which the data latches 494 will indicate the erase state or the A-state. Therefore, a "1" is shown in the first row in the columns Er (memory cell is to stay erased), the columns Ain, Bin, Cin, as well as the columns A, Aq, which represent cases in which the data latches 494 still contain A-state data because the memory cell has not yet been programmed to the A-state.

The second row in table 1420 shows possible values in the QPW latch when performing the coarse verify for the B-state. For example, if the memory cell is not yet programmed it may have a Vt that is either above or below VvbL. Note that this is true for memory cells being programmed to either the B- or C-state. Therefore, table 1420 indicates the uncertain value of "0/1" for the unprogrammed B- and C-state cases. Table 1420 has a "1" for Bq, Bin, Cq and Cin because the Vt will be higher than the VvbL voltage level for those cases.

The third row in the table 1420 has a "1" for the cases for which the bit line should be biased when performing the fine B-state verify. In this example, this applies to every case but memory cells that are to stay erased and those that have been or are to be programmed to the A-state. In other words, the bit lines of memory cells that either have or are to be programmed to the B- and C-states are biased. The third row is formed from a combination of the first two rows. Specifically, the third row is formed from QPW OR NOT (Er OR A). In other words, either the QPW is set to 1 OR if the data latches 494 contain anything other than erase data or A-state data, then the third row should be "1." For example, for the cases of B, Bq, C, Cq, the data latches 494 do not contain erase data. Therefore, the third row is set to "1" for those values. Also, if the QPW is set, the third row is set. For example, for Bq, Bin, Cq, and Cin the QPW is set. Therefore, the corresponding boxes in the third row are set. Note that combining the QPW latch with the data latches 494 could be performed in other ways.

In step 1314, bit lines for memory cells that are to be programmed to either the B- or C-state are charged, whereas all other bit lines are not charged. The correct bit lines were determined in step 1312, as previously discussed.

In step 1316, a fine verify of the B-state is performed with the bit line conditions established in step 1314. For example, a voltage VvB may be applied to the selected word line and then the bit lines may be sensed. Step 1316 is one embodiment of step 770 of FIG. 7C. Therefore, after sensing the bit lines, a determination may be made whether verification passed (step 772, FIG. 7C). If verification passed and the bit line is to be inhibited, then the data latches 494 may be set to the erased state to provide the inhibit indicator (step 774, FIG. 7C).

In step 1318, a coarse verify of the C-state is performed. During the course verify, all bit lines may be charged. Note that it is not required that the bit line bias used during the coarse verify match the bit line bias used during the read of that state. Step 1318 may include sensing bit lines for conduction current and storing a value in a QPW latch based on whether the bit line conducts a significant current. For example, if the threshold voltage of the memory cell is greater than VvcL, then the QPW latch is set to "1." Step 1318 is one embodiment of steps 756-762 of FIG. 7C.

Note that after step 1318, the data latches for the memory cell may contain the original program data, or the program data may have been set to the erase state to indicate that further programming should be inhibited. Therefore, if the data latches 494 indicates a data state other than erase, the data latches 494 indicate the state to which the memory cell is to be programmed. However, if the data latches 494 indicate the erase state, then it is uncertain whether the memory cell was one that was to remain erased or has been programmed to another state and is now inhibited from further programming.

In step 1320, data from the QPW latch is combined with the current data from the data latches 494 to determine whether the data latches contain actual erase data or inhibit data. For the VerifyC cases, it is desirable to determine which bit lines either have memory cells that were to stay erased or those that are/were to be programmed to either the A- or B-states. Table 1440 of FIG. 14C will be referred to when discussing step 1320. The first row in table 1440 contains a "1" for the cases in which the data latches 494 will indicate the erase state, the A-state, or the B-state. Therefore, a "1" is shown in the first row in the columns Er (memory cell is to stay erased), the columns Ain, Bin, Cin, as well as the columns A, Aq, B, Bq. Note that A, Aq, B, Bq represent cases in which the data latches 494 still contain either A-state or B-state data because the memory cell has not yet been programmed to the A- or B-state.

The second row in table 1440 shows possible values in the QPW latch when performing the coarse verify for the C-state. For example, if the memory cell is not yet programmed it may have a Vt that is either above or below VvcL. Therefore, table 1440 indicates the uncertain value of "0/1" for the unprogrammed C-state cases. Table 1440 has a "1" for Cq and Cin because the Vt will be higher than the VvcL voltage level for those cases. The third row in table 1440 has a "1" for the cases for which the bit line should be biased when performing the fine C-state verify. In this example, this applies only to bit lines of memory cells that either have been or are to be programmed to the C-state.

The third row is formed from a combination of the first two rows. Specifically, the third row is formed from QPW OR NOT (Er OR A OR B). In other words, either the QPW latch is set to "1" OR the data latches 494 contain anything other than erase data, A-state data, or B-state data. For example, for the cases of C, Cq, the data latches 494 do not contain erase data. Therefore, the third row is set for those values. Also, if the QPW is set, the third row is set. For example, for Cq and Cin the QPW latch is set (for C it may or may not be set). Note that combining the QPW latch with the data latches 494 could be performed in other ways.

In step 1322, bit lines for memory cells that are to be programmed to either the C-state are charged, whereas all other bit lines are not charged. The correct bit lines were determined in step 1320, as previously discussed.

In step 1324, a fine verify of the C-state is performed with the bit line conditions established in step 1322. For example, a voltage VvC may be applied to the selected word line and then the bit lines may be sensed. Step 1324 is one embodiment of step 770 of FIG. 7C. Therefore, after sensing the bit lines, a determination may be made whether verification passed (step 772, FIG. 7C). If verification passed and the bit line is to be inhibited, then the data latches 494 may be set to the erased state to provide the inhibit indicator (step 774, FIG. 7C). After the fine verify of the C-state, step 724 of FIG. 7A may be performed to determine whether all memory cells have passed verify. Then, the process of FIG. 7A may continue to program memory cells until all memory cells are programmed (step 726) or programming fails (step 730).

Figure 15:
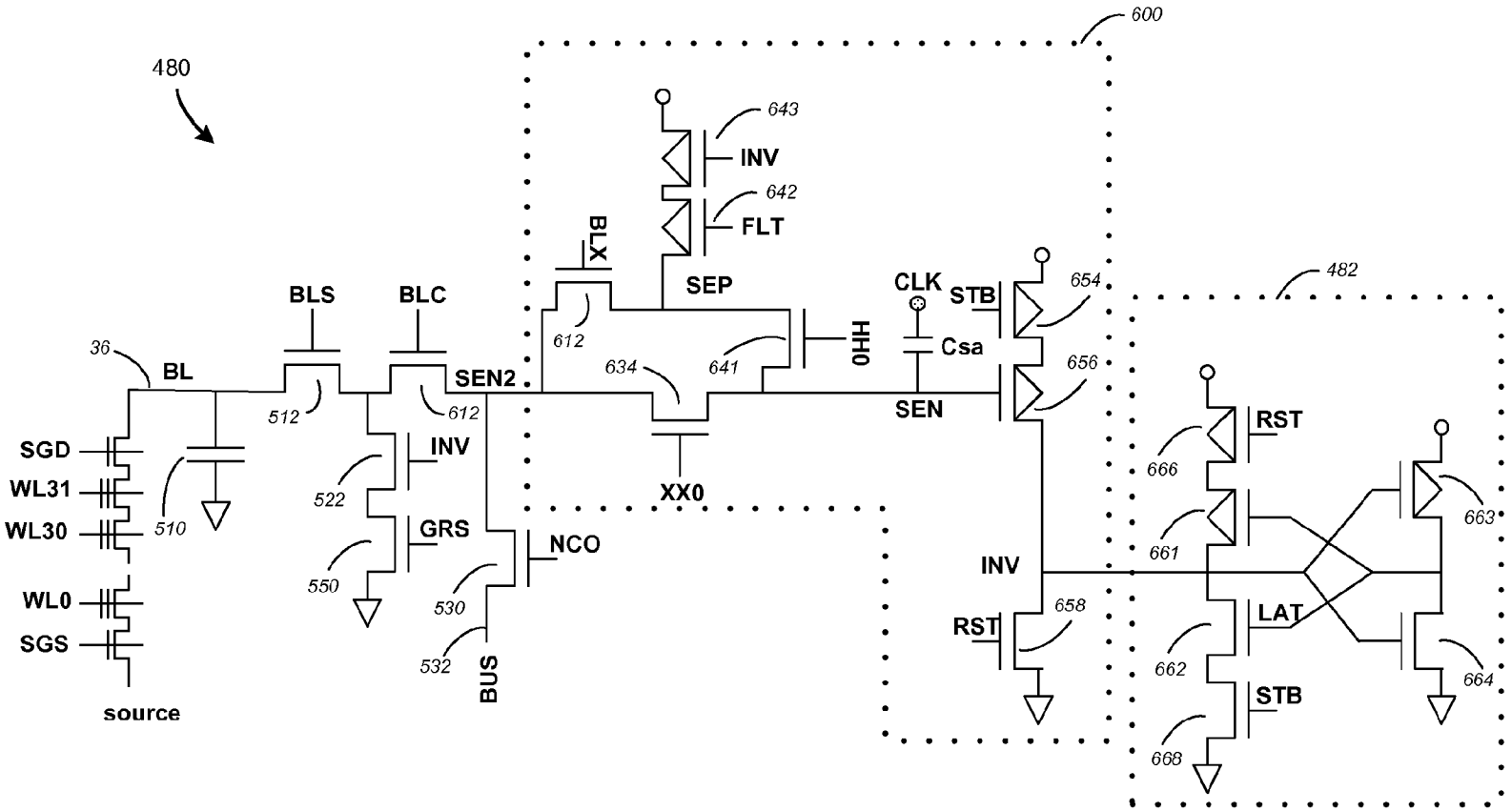
FIG. 15 illustrates an example of sense module.
Figure 16:
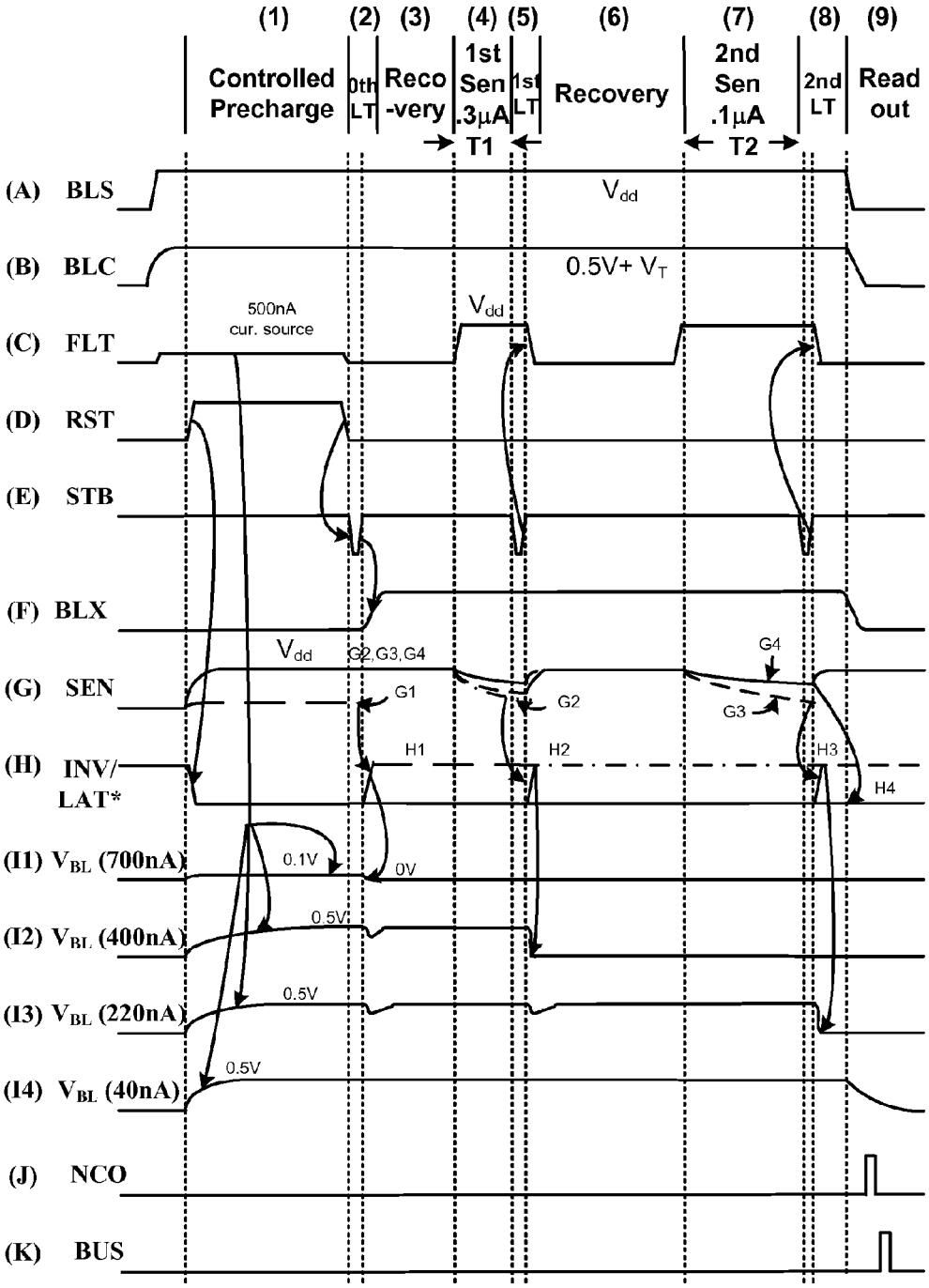
FIG. 16 depicts a timing diagram of one embodiment of sensing during a read or verify using the sense amplifier of FIG. 15.

FIG. 15 illustrates an example of sense module 480; however, other implementations can also be used. Sense module 480 may be used in various embodiments during both the verify and the read process. FIG. 16 depicts a timing diagram of one embodiment of sensing during a read or verify using the sense amplifier of FIG. 15. In the timing diagram of FIG. 16, a "multi-strobe" sense operation is performed. Therefore, the sense amplifier of FIG. 15 may be used in embodiments that employ a multi-strobe read. Note that the sense amplifier is not required to perform a multi-strobe sense operation. For example, a single strobe sense operation may be performed.

Sense module 480 comprises bit line isolation transistor 512, bit line pull down circuit (transistors 522 and 550), bit line voltage clamp transistor 612, readout bus transfer gate 530, sense amplifier 470 and bit line latch 482. One side of bit line isolation transistor 512 is connected to the bit line BL and capacitor 510. The other side of bit line isolation transistor 512 is connected to bit line voltage clamp transistor 612 and bit line pull down transistor 522. The gate of bit line isolation transistor 512 receives a signal labeled as BLS. The gate of bit line voltage clamp transistor 512 receives a signal labeled as BLC. Bit line voltage clamp transistor 512 is connected to readout bus transfer gate 530 at node SEN2. Readout bus transfer gate 530 is connected to readout bus 532. Bit line voltage clamp transistor 512 connects to sense amplifier 470 at node SEN2. In the embodiment of FIG. 9, sense amplifier 470 includes transistors 613, 634, 641, 642, 643,654, 654 and 658, as well as capacitor Csa, Bit line latch 482 includes transistors 661, 662, 663, 664, 666 and 668.

In general, memory cells along a word line may be operated on in parallel. Therefore a corresponding number of sense modules may be in operation in parallel. In one embodiment, a controller provides control and timing signals to the sense modules operating in parallel. In some embodiments, data along a word line is divided into multiple pages, and the data is read or programmed a page at a time, or multiple pages at a time.

Sense module 480 is connectable to the bit line (e.g., bit line BL) for a memory cell when the bit line isolation transistor 512 is enabled by signal BLS. Sense module 480 senses the conduction current of the memory cell by means of sense amplifier 470 and latches the read result as a digital voltage level at a sense node SEN2 and outputs it to readout bus 532 via gate 530.

The sense amplifier 470 comprises a second voltage clamp (transistors 612 and 634), a pre-charge circuit (transistors 541, 642 and 643), and a discriminator or compare circuit (transistors 654, 656 and 658; and capacitor Csa). In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many embodiments, the on/off may be a continuous transition so that the memory cell will conduct different currents in response to different control gate voltages. If the memory cell is on and conducting current, the conducted current will cause the voltage on node SEN to decrease, effectively charging or increasing the voltage across capacitor Csa whose other terminal is at Vdd. If the voltage on node SEN discharges to a predetermined level during a predetermined sensing period, then sense amplifier 470 reports that the memory cell turned on in response to the control gate voltage.

One feature of the sense module 480 is the incorporation of a constant voltage supply to the bit line during sensing. This is preferably implemented by the bit line voltage clamp transistor 612, which operates like a diode clamp with transistor 612 in series with the bit line BL. Its gate is biased to a constant voltage BLC equal to the desired bit line voltage VBL above its threshold voltage VT. In this way, it isolates the bit line from the node SEN and sets a constant voltage level for the bit line, such as the desired VBL=0.5 to 0.7 volts during program-verifying or reading. In general, the bit line voltage level is set to a level such that it is sufficiently low to avoid a long precharge time, yet sufficiently high to avoid ground noise and other factors.

Sense amplifier 470 senses the conduction current through the sense node SEN and determines whether the conduction current is above or below a predetermined value. The sense amplifier outputs the sensed result in a digital form as the signal SEN2 to readout bus 532.

The digital control signal INV, which can essentially be an inverted state of the signal at SEN2, is also output to control the pull down circuit. When the sensed conduction current is higher than the predetermined value, INV will be HIGH and SEN2 will be LOW. This result is reinforced by the pull down circuit. The pull down circuit includes an n-transistor 522 controlled by the control signal INV and another n-transistor 550 controlled by the control signal GRS. The GRS signal when LOW allows the bit line BL to be floated regardless of the state of the INV signal. During programming, the GRS signal goes HIGH to allow the bit line BL to be pulled to ground and controlled by INV. When the bit line BL is required to be floated, the GRS signal goes LOW. Note that other designs of sense modules, sense amplifiers and latches can also be used.

In some embodiments, multi-pass sensing (e.g., two-strobe sensing) is used. Each pass helps to identify and shut down the memory cells with conduction current higher than a given demarcation current value. This may be used to select which bit lines are biased on the final sensing of memory cells. Therefore, appropriate bit line biasing conditions may be established. For example, multi-pass sensing can be implemented in two passes (j=0 to 1). After the first pass, those memory cells with conduction currents higher than the breakpoint are identified and removed by turning off their conduction current. One way to turn off their conduction currents is to set their drain voltages on their bit lines to ground. More than two passes are also contemplated. In some embodiments, one pass (a single strobe) can be used for sensing.

FIG. 16 depicts a timing diagram of one embodiment of sensing during a read or verify using the sense amplifier of FIG. 15. FIGS. 16(A)-16(K) depicts timing diagrams that explain one embodiment of sense module 480 during read/verify operations.

PHASE (0): Setup

The sense module 480 (see FIG. 15) is connected to the corresponding bit line via an enabling signal BLS (FIG. 16(A)). The Voltage clamp is enabled with BLC (FIG. 16(B)). Pre-charge transistor 642 is enabled as a limited-current source with a control signal FLT (FIG. 16(C)).

PHASE (1): Controlled Pre-charge

Sense amplifier 470 is initialized by a reset signal RST (FIG. 16(D)) which will pull the signal INV (FIG. 16(H)) to ground via transistor 658. Thus, on reset, INV is set to LOW. At the same time, p-transistor 663 pulls a complementary signal LAT to $V_{dd}$ or HIGH (FIG. 16(H)). That is, LAT is the complement of INV. Isolation transistor 634 is controlled by the signal LAT. Thus, after reset, isolation transistor 634 is enabled to connect sense node SEN2 to the sense amplifier's internal sense node SEN.

Pre-charge transistor 642 pre-charges the bit line BL through the internal sense node SEN and the sense node SEN2 for a predetermined period of time. This will bring the bit line to an optimal voltage for sensing the conduction therein. Pre-charge transistor 642 is controlled by the control signal FLT ("FLOAT"). The bit line will be pulled up towards the desired bit line voltage as set by the bit line voltage clamp 612. The rate of pull-up will depend on the conduction current in the bit line. The smaller the conduction current, the faster the pull-up.

The D.C. sensing is accomplished by providing a pre-charge circuit that behaves like a current source for supplying a predetermined current to the bit line. The signal FLT that controls the p-transistor 642 is such that it "programs" a predetermined current to flow. As an example, the FLT signal may be generated from a current mirror with a reference current set to 500 nA. When the p-transistor 642 forms the mirrored leg of the current mirror, it will also have the same 500 nA flowing in it.

FIGS. 16(I1)-16(I4) illustrate the voltages on four example bit lines connected respectively to memory cells with conduction currents of 700 nA, 400 nA, 220 nA and 40 nA. When a pre-charge circuit (which includes transistor 642) is a current source with a limit of 500 nA, for example, a memory cell having a conduction current exceeding 500 nA will have the charges on the bit line drained faster than it can accumulate. Consequently, for the bit line with conduction current 700 nA, its voltage or the signal at the internal sense node SEN will remain close to 0V (such as 0.1 volt; see FIG. 16(I1)). On the other hand, if the memory cell's conduction current is below 500 nA, the pre-charge circuit (which includes transistor 642) will begin to charge up the bit line and its voltage will begin to rise towards the clamped bit line voltage (e.g., 0.5V set by the voltage clamp 612) (FIGS. 16(I2)-16(I4)). Correspondingly, the internal sense node SEN will either remain close to 0V or be pulled up to Vdd (FIG. 16(G)). Generally, the smaller the conduction current, the faster the bit line voltage will charge up to the clamped bit line voltage. Thus, by examining the voltage on a bit line after the controlled pre-charge phase, it is possible to identify if the connected memory cell has a conduction current higher or lower than a predetermined level.

PHASE (2): D.C. Latching & Removing High Current Cells from Subsequent Strobes

After the controlled pre-charge phase, an initial D.C. high-current sensing phase begins where the node SEN is sensed by the discriminator circuit. The sensing identifies those memory cells with conduction currents higher than the predetermined level. The discriminator circuit includes two p-transistors 654 and 656 in series, which serve as a pull-up for a node registering the signal INV. The p-transistor 654 is enabled by a read strobe signal STB going LOW and the p-transistor 656 is enabled by the signal at the internal sense node SEN going LOW. High current memory cells will have the signal SEN close to 0V or at least unable for its bit lines to be pre-charged sufficiently high to turn off the p-transistor 656. For example, if the weak pull up is limited to a current of 500 nA, it will fail to pull up a cell with conduction current of 700 nA (FIG. 16(G1)). When STB strobes LOW to latch, INV is pulled up to $V_{dd}$. This will set the latch circuit 660 with INV HIGH and LAT LOW (FIG. 16(H1)).

When INV is HIGH and LAT LOW, the isolation gate 630 is disabled and the sense node SEN2 is blocked from the internal sense node SEN. At the same time, the bit line is pulled to ground by the pull down transistor 522 (FIGS. 16 & 16(I1)). This will effectively turn off any conduction current in the bit line, eliminating it from contributing to source line bias.

Thus, in one implementation of the sense module 480, a limited-current source pre-charge circuit is employed. This provides an additional or alternative way (D.C. sensing) to identify bit lines carrying high currents and to turn them off.

In another embodiment, the pre-charge circuit is not specifically configured to help identify high current bit lines but is optimized to pull up and pre-charge the bit line as fast as possible within the allowance of the maximum current available to the memory system.

PHASE (3): Recovery/Pre-charge

Prior to a sensing of the conduction current in a bit line that has not been previously pulled down, the pre-charge circuit is activated by the signal FLT going LOW to pre-charge the internal sense node SEN2 to $V_{dd}$ (FIG. 16(C) and FIGS. 16(I2)-16(I4)) and the bit line which may have been partially coupled down due to a decrease in the voltage on adjacent bit lines.

PHASE (4): First A.C. Sensing

In one embodiment, an A.C. (Alternating Current or transient) sensing is performed by determining the voltage drop at the floated internal sense node SEN. This is accomplished by the discriminator circuit employing the capacitor Csa coupled to the internal sense node SEN, and considering the rate the conduction current is charging it (reducing the voltage on node SEN). In an integrated circuit environment, the capacitor Csa is typically implemented with a transistor; however, other implementations are suitable. Capacitor Csa has a predetermined capacitance, e.g., 30 fF, which can be selected for optimal current determination. The demarcation current value, typically in the range of 100-1000 nA, can be set by appropriate adjustment of the charging period.

The discriminator circuit senses the signal SEN in the internal sense node SEN. Prior to each sensing, the signal at the internal sense node SEN is pulled up to $V_{dd}$ by pre0charge transistor 642. This will initially set the voltage across the capacitor Csa to be zero.

When the sense amplifier 470 is ready to sense, the pre-charge circuit is disabled by FLT going HIGH (FIG. 16(C)). The first sensing period T1 is ended by the assertion of the strobe signal STB. During the sensing period, a conduction current induced by a conducting memory cell will charge the capacitor. The voltage at SEN will decrease from $V_{dd}$ as the capacitor Csa is charged through the draining action of the conduction current in the bit line. FIG. 16(G) (see curves G2-G4) illustrates the SEN node corresponding to the remaining three example bit lines connected respectively to memory cells with conduction currents of 400 nA, 220 nA and 40 nA, the decrease being more rapid for those with a higher conduction current.

PHASE (5): First A.C. Latching and Removal of Higher Current Cells from Subsequent Sensing At the end of the first predetermined sensing period, the SEN node will have decreased to some voltage depending on the conduction current in the bit line (see curves G2-G4 of FIG. 16(G). As an example, the demarcation current in this first phase is set to be at 300 nA. The capacitor Csa, the sensing period T1 and the threshold voltage of the p-transistor 656 are such that the signal at SEN corresponding to a conduction current higher than the demarcation current (e.g., 300 nA) will drop sufficiently low to turn on the transistor 656. When latching signal STB strobes LOW, the output signal INV will be pulled HIGH, and will be latched by the latch 482 (FIG. 16(E) and FIG. 16(H) (curve H2)). On the other hand, the signal SEN corresponding to a conduction current below the demarcation current will produce a signal SEN unable to turn on the transistor 656. In this case, the latch 482 will remain unchanged, in which case LAT remains HIGH (FIGS. 16(H3) and 16(H4)). Thus, it can be seen that the discriminator circuit effectively determines the magnitude of the conduction current in the bit line relative to a reference current set by the sensing period.

Sense amplifier 470 also includes the second voltage clamp transistor 612 whose purpose is to maintain the voltage of the drain of the transistor 612 sufficiently high in order for the bit line voltage clamp 610 to function properly. As described earlier, the bit line voltage clamp 610 clamps the bit line voltage to a predetermined value $V_{BL}$, e.g., 0.5V. This will require the gate voltage BLC of the transistor 612 to be set at $V_{BL}+V_T$ (where $V_T$ is the threshold voltage of the transistor 612) and the drain connected to the sense node 501 to be greater than the source, i.e., the signal SEN2>$V_{BL}$. In particular, given the configurations of the voltage clamps, SEN2 should be no higher than the smaller of XX0-$V_T$ or BLX-$V_T$, and SEN should be no lower. During sensing, the isolation gate 630 is in a pass-through mode. However, during sensing the signal at the internal sense node SEN has a voltage that decreases from $V_{dd}$. The second voltage clamp prevents SEN from dropping below XX0-$V_T$ or BLX-$V_T$, whichever is lower. This is accomplished by an n-transistor 612 controlled by a signal BLX, where BLX is $\geq V_{BL}+V_T$. Thus, through the actions of the voltage clamps, the bit line voltage $V_{BL}$ is kept constant, e.g., ~0.5V, during sensing.

The output of the current determination is latched by the latch circuit 482. The latch circuit is formed as a Set/Reset latch by the transistors 661, 662, 663 and 664 together with the transistors 666 and 668. The p-transistor 666 is controlled by the signal RST (RESET) and the n-transistor 668 is controlled by the signal STB.

In general, there may be a page of memory cells being operated on by a corresponding number of multi-pass sense modules 480. For those memory cells having conduction current higher than the first demarcation current level, their LAT signal will be latched LOW (INV latched HIGH). This in turn activates the bit line pull down circuit 520 to pull the corresponding bit lines to ground, thereby turning off their currents. In some embodiments, this helps to establish the bit line conditions for verify. For example, in step 1224 of FIG. 12B, the rough read of the A-state may be accomplished by the sensing up to this point. Note that the strobe signal may be asserted more than twice during the entire sense process. For example, in FIG. 16, the strobe signal is asserted three times, with the final strobe being the final read. In this example, the strobes during periods 1 and 5 may accomplish the rough read. In some embodiments, at least one of the strobes during periods 1 and 5 is considered the first strobe of a two-strobe read.

PHASE (6): Recovery/Pre-charge

Prior to the next sensing of the conduction current in a bit line that has not been previously pulled down, the pre-charge circuit is activated by the signal FLT to pre-charge the internal sense node 631 to $V_{dd}$ (FIG. 16(C) and FIGS. 16(I3)-16(I4)).

PHASE (7): Second Sensing

When the sense amplifier 470 is ready to sense, the pre-charge circuit is disabled by FLT going HIGH (FIG. 16(C)). The second sensing period T2 is set by the assertion of the strobe signal STB. During the sensing period, a conduction current, if any, will charge the capacitor. The signal at the node SEN will decrease from $V_{dd}$ as capacitor Csa is charging through the draining action of the conduction current in the bit line 36.

In accordance with the example before, the memory cells with conduction currents higher than 300 nA have already been identified and shut down in the earlier phases. FIG. 16(G) (curves G3 and G4) illustrate respectively the SEN signal corresponding to the two example bit lines connected respectively to memory cells with conduction currents of 220 nA and 40 nA.

In one embodiment, the memory cells with condition currents that are associated with states below the state presently being read are shut down.

PHASE (8): Second Latching for Reading Out

At the end of the second predetermined sensing period T2, SEN will have decreased to some voltage depending on the conduction current in the bit line (FIG. 16(G) (curves G3 and G4)). As an example, the demarcation current in this second phase is set to be at 100 nA. In this case, the memory cell with the conduction current 220 nA will have its INV latched HIGH (FIG. 16(H)) and its bit line subsequently pulled to ground (FIG. 16(I3)). On the other hand, the memory cell with the conduction current 40 nA will have no effect on the state of the latch, which was preset with LAT HIGH.

PHASE (9): Read Out to the Bus

Finally, in the read out phase, the control signal NCO at the transfer gate 530 allows the latched signal SEN2 to be read out to the readout bus 532 (FIGS. 16(J) and 16(K)).

The sense module 480 described above is one embodiment where sensing is performed with three passes, the first two passes being implemented to identify and shut down higher current memory cells. This may serve as a rough read to help establish proper bit line bias conditions for a verify, which may occur during the final pass (e.g., T7).

In other embodiments, sensing operations are implemented with different combination of D.C. and A.C. passes, some using only two or more A.C. passes, or only one pass. For the different passes, the demarcation current value used may be the same each time or converge progressively towards the demarcation current used in the final pass. Additionally, the sensing embodiment described above is just one example of a suitable sense module. Other designs and technologies can also be used to implement embodiments described herein. No one particular sense module is required or suggested for the embodiments described herein.

One embodiment includes a method for operating a non-volatile storage system that includes a plurality of bit lines that are associated with a word line. A plurality of non-volatile storage elements are associated with the word line. The method may include the following. One or more programming voltages are applied to the word line. First bias conditions are established on the plurality of bit lines when verifying each of a plurality of programmed states. A separate set of first bias conditions may be established when verifying each programmed state. Biasing a bit line may be based on the state to which a non-volatile storage elements on the bit line is being programmed. Conditions of bit lines of the non-volatile storage elements are sensed establishing the first bias conditions. Second bias conditions are established on the plurality of bit lines during a read process. A separate set of second bias conditions are established for each state being read. The second bias conditions for a given state substantially match the first bias conditions for the given state. Bit lines of non-volatile storage elements are sensed during the read process.

In one embodiment, in the method of the previous paragraph, non-volatile storage elements that are neighbors of target non-volatile storage elements being programmed to a given state have a channel potential during verify of the given state that depends on the channel potential of the target non-volatile storage elements. In one embodiment, in the method of the previous paragraph, establishing the second bias conditions on the plurality of bit lines when reading the given state causes substantially all non-volatile storage elements that are neighbors of non-volatile storage elements that were programmed to the given state to have a channel potential that matches the channel potential of the neighbor when verifying the given state.

One embodiment is a method for operating a non-volatile storage system that includes a plurality of bit lines that are associated with a word line. A plurality of non-volatile storage elements are associated with the word line. The method may include the following. A first voltage level is established on a first group of bit lines of the plurality of bit lines. Establishing the first voltage level is performed as part of a program verify operation to verify whether threshold voltages of the non-volatile storage elements are at a target level associated with a first programmed state of a plurality of programmed states. The first group of bit lines includes at least those bits lines that have a non-volatile storage element of the plurality of non-volatile storage elements that is to be programmed to the first state. A ground voltage is established on a second group of the plurality of bit lines as part of the program verify operation. The second group of bit lines includes all bit lines in the plurality of bit lines other than the first group of bit lines. The second group of bit lines includes at least some bit lines that have a non-volatile storage element that is to be programmed to a programmed state other than the first programmed state. At least one read is performed of the non-volatile storage elements associated with the word line to roughly determine which of the bit lines were in the first group and which of the bit lines were in the second group during the verify operation. A ground voltage is established on the bit lines that were roughly determined to be in the second group. A fine read of the plurality of non-volatile storage elements associated with the word line is performed to determine which of the non-volatile storage elements have of threshold voltage of at least the target level. Performing the fine read includes biasing the bit lines that were roughly determined to be in the first group at a second voltage level while holding the bit lines that were roughly determined to be in the second group at ground.

One embodiment includes a system that includes a plurality of non-volatile storage elements, a plurality of bit lines that are associated with the plurality of non-volatile storage elements, a plurality of word lines that are associated with the plurality of non-volatile storage elements, the plurality of word lines includes a first word line, and one or more managing circuits that are in communication with the plurality of non-volatile storage elements, the plurality of bit lines, and the plurality of word lines. The one or more managing circuits apply one or more programming voltages to the word line. The one or more managing circuits establish first bias conditions on the plurality of bit lines when verifying each of a plurality of programmed states. A separate set of first bias conditions are established when verifying each programmed state. Biasing a bit line is based on the state to which a non-volatile storage elements on the bit line is being programmed. The one or more managing circuits sense conditions of bit lines of the non-volatile storage elements after establishing the first bias conditions. The one or more managing circuits establish second bias conditions on the plurality of bit lines during a read process. A separate set of second bias conditions are established for each state being read. The second bias conditions for a given state substantially match the first bias conditions for the given state. The one or more managing circuits sense bit lines of non-volatile storage elements during the read process.

One embodiment includes a system that includes a plurality of non-volatile storage elements, a plurality of bit lines that are associated with the plurality of non-volatile storage elements, a plurality of word lines that are associated with the plurality of non-volatile storage elements, the plurality of word lines includes a first word line, and one or more managing circuits that are in communication with the plurality of non-volatile storage elements, the plurality of bit lines, and the plurality of word lines. The one or more managing circuits apply one or more programming voltages to the word line. The one or more managing circuits establish a first voltage level on a first group of the bit lines, establishing the first voltage level is performed as part of a program verify operation to verify whether threshold voltages are at a target level associated with a first programmed state of a plurality of programmed states. The first group of bit lines includes at least those bits lines that have a non-volatile storage element of the plurality of non-volatile storage elements that is to be programmed to the first state. The one or more managing circuits establish a ground voltage on a second group of the plurality of bit lines as part of the program verify operation. The second group of bit lines includes all bit lines in the plurality of bit lines other than the first group of bit lines, the second group of bit lines includes at least some bit lines that have a non-volatile storage element associated with the first word line that is to be programmed to a programmed state other than the first programmed state. The one or more managing circuits perform at least one read of the non-volatile storage elements associated with the first word line to roughly determine which of the bit lines were in the first group and which of the bit lines were in the second group during the verify operation. The one or more managing circuits establish a ground voltage on the bit lines that were roughly determined to be in the second group. The one or more managing circuits perform a fine read of the plurality of non-volatile storage elements associated with the first word line to determine which of the non-volatile storage elements have of threshold voltage of at least the target level. Performing the fine read includes the one or more managing circuits biasing the bit lines that were roughly determined to be in the first group at a second voltage level while biasing the bit lines that were roughly determined to be in the second group at ground.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain the principles of the disclosure and practical applications, to thereby enable others skilled in the art to best utilize the various embodiments and with various modifications as are suited to the particular use contemplated. It is intended that the scope of the disclosure be defined by the claims appended hereto.

What is claimed is:

1. A method for operating a non-volatile storage system that includes a plurality of bit lines that are associated with a word line, a plurality of non-volatile storage elements are associated with the word line, comprising:

applying one or more programming voltages to the word line;

establishing first bias conditions on the plurality of bit lines when verifying each of a plurality of programmed states, a separate set of first bias conditions are established when verifying each programmed state, the biasing a bit line is based on the state to which a non-volatile storage elements on the bit line is being programmed;

sensing conditions of bit lines of the plurality of bit lines after establishing the first bias conditions;

establishing second bias conditions on the plurality of bit lines during a read process, a separate set of second bias conditions are established for each programmed state being read, the second bias conditions for a given programmed state substantially match the first bias conditions for the given programmed state; and sensing bit lines of non-volatile storage elements during the read process.

2. The method of claim 1, wherein non-volatile storage elements that are neighbors of non-volatile storage elements being programmed to a given programmed state have a channel potential during verify of the given programmed state that depends on the channel potential of the target non-volatile storage element.

3. The method of claim 2, wherein establishing the second bias conditions on the plurality of bit lines when reading the given state causes substantially all non-volatile storage elements that are neighbors of non-volatile storage elements that were programmed to the given state to have a channel potential that matches the channel potential of the neighbor when verifying the given state.

4. The method of claim 1, wherein the establishing first bias conditions includes:

pre-charging those bit lines of the plurality of bit lines that have a non-volatile storage element to be programmed to the state currently being verified and those bit lines that have a non-volatile storage element to be programmed to the programmed state immediately below the state currently being verified; and grounding all other bit lines of the plurality of bit lines.

5. The method of claim 1, further comprising:

performing reads at a plurality of reference voltage levels to roughly determine what state each of the non-volatile storage elements is in, the second bias conditions are based on the reads.

6. The method of claim 5, wherein the establishing second bias conditions includes:

pre-charging those bit lines of the plurality of bit lines that have a non-volatile storage element that was roughly determined to be in the state currently being read and those bit lines that have a non-volatile storage element that was roughly determined to be in the programmed state immediately below the state currently being read; and grounding all other bit lines of the plurality of bit lines.

7. The method of claim 1, wherein the establishing first bias conditions includes:

pre-charging those bit lines that have a non-volatile storage element to be programmed to the state currently being verified; and grounding all other bit lines of the plurality of bit lines.

8. The method of claim 7, wherein the establishing the second bias conditions includes:

pre-charging all bit lines of the plurality of bit lines;

performing a rough read at a voltage level associated with the highest programmed state of the plurality of programmed states to establish a first set of the second bias conditions for reading at the highest programmed state;

performing a rough read at a voltage level associated with the next highest programmed state of the plurality of programmed states;

discharging all bit lines that have a non-volatile storage element with a threshold voltage above the voltage associated with the next highest programmed state after the rough read at a voltage level associated with the next highest programmed state to establish a second set of the second bias conditions for reading at the next highest programmed state;

performing a rough read at a voltage level associated with the lowest programmed state of the plurality of programmed states;

discharging all bit lines that have a non-volatile storage element with a threshold voltage above the voltage associated with state above the lowest programmed state after the rough read at a voltage level associated with the lowest programmed state to establish a third set of the second bias conditions for reading at the lowest programmed state.

9. The method of claim 1, wherein the establishing first bias conditions includes:

pre-charging those bit lines that have a non-volatile storage element to be programmed to the programmed state currently being verified and bit lines that have a non-volatile storage element to be programmed to any higher programmed state than the programmed state currently being verified; and grounding all other bit lines of the plurality of bit lines.

10. The method of claim 9, wherein the establishing the second bias conditions includes:

pre-charging all bit lines of the plurality of bit lines;

performing a rough read at a voltage level associated with the lowest programmed state of the plurality of programmed states to establish a first set of the second bias conditions for reading at the lowest programmed state;

performing a rough read at a voltage level associated with the next highest programmed state of the plurality of programmed states to establish a second set of the second bias conditions for reading at the next highest programmed state; and performing a rough read at a voltage level associated with the highest programmed state of the plurality of programmed states to establish a third set of the second bias conditions for reading at the highest programmed state.

11. The method of claim 1, further comprising:

storing first values for respective memory cells that indicate that the respective memory cell has reached a coarse verify level when verifying each of a plurality of programmed states;

overwriting values in a data latch that indicate the state to be programmed into respective memory cells when the respective memory cell reaches a fine verify level when verifying each of a plurality of programmed states; and combining the first value for a given memory cell with the present values in the data latch for the given memory cell to determine how to establish first bias conditions for the bit line for the given memory cell.

12. A method for operating a non-volatile storage system that includes a plurality of bit lines that are associated with a word line, a plurality of non-volatile storage elements are associated with the word line, comprising:

establishing a first voltage level on a first group of bit lines of the plurality of bit lines, establishing the first voltage level is performed as part of a program verify operation to verify whether threshold voltages of the non-volatile storage elements are at a target level associated with a first programmed state of a plurality of programmed states, the first group of bit lines includes at least those bits lines that have a non-volatile storage element of the plurality of non-volatile storage elements that is to be programmed to the first state;

establishing a ground voltage on a second group of the plurality of bit lines as part of the program verify operation, the second group of bit lines includes all bit lines in the plurality of bit lines other than the first group of bit lines, the second group of bit lines includes at least some bit lines that have a non-volatile storage element that is to be programmed to a programmed state other than the first programmed state;

performing at least one read of the non-volatile storage elements associated with the word line to roughly determine which of the bit lines were in the first group and which of the bit lines were in the second group during the verify operation;

establishing a ground voltage on the bit lines that were roughly determined to be in the second group; and performing a fine read of the plurality of non-volatile storage elements associated with the word line to determine which of the non-volatile storage elements have of threshold voltage of at least the target level, performing the fine read includes biasing the bit lines that were roughly determined to be in the first group at a second voltage level while holding the bit lines that were roughly determined to be in the second group at ground.

13. A system comprising:

a plurality of non-volatile storage elements;

a plurality of bit lines that are associated with the plurality of non-volatile storage elements;

a plurality of word lines that are associated with the plurality of non-volatile storage elements, the plurality of word lines includes a first word line; and one or more managing circuits that are in communication with the plurality of non-volatile storage elements, the plurality of bit lines, and the plurality of word lines, the one or more managing circuits apply one or more programming voltages to the word line, the one or more managing circuits establish first bias conditions on the plurality of bit lines when verifying each of a plurality of programmed states, a separate set of first bias conditions are established when verifying each programmed state, the biasing a bit line is based on the state to which a non-volatile storage elements on the bit line is being programmed, the one or more managing circuits sense conditions of bit lines of the non-volatile storage elements after establishing the first bias conditions, the one or more managing circuits establish second bias conditions on the plurality of bit lines during the read process, a separate set of second bias conditions are established for each programmed state being read, the second bias conditions for a given state substantially match the first bias conditions for the given programmed state, the one or more managing circuits sense bit lines of non-volatile storage elements during the read process.

14. The system of claim 13, wherein non-volatile storage elements that are neighbors of target non-volatile storage elements being programmed to a given programmed state have a channel potential during verify of the given state that depends on the channel potential of the target non-volatile storage element.

15. The system of claim 14, wherein to establishing the second bias conditions on the plurality of bit lines when reading the given state causes substantially all non-volatile storage elements that are neighbors of non-volatile storage elements that were programmed to the given state to have a channel potential that matches the channel potential of the neighbor when verifying the given state.

16. The system of claim 13, wherein to establish first bias conditions, the one or more managing circuits pre-charge those bit lines of the plurality of bit lines that have a non-volatile storage element to be programmed to the state currently being verified and those bit lines that have a non-volatile storage element to be programmed to the programmed state immediately below the state currently being verified, the one or more managing circuits ground all other bit lines of the plurality of bit lines to establish first bias conditions.

17. The system of claim 13, wherein the one or more managing circuits read at a plurality of reference voltage levels to roughly determine what programmed state each of the non-volatile storage elements is in, the second bias conditions are based on the reads.

18. The system of claim 17, wherein to establish second bias conditions the one or more managing circuits pre-charge those bit lines of the plurality of bit lines that have a non-volatile storage element that was roughly determined to be in the programmed state currently being read and those bit lines that have a non-volatile storage element that was roughly determined to be in the programmed state immediately below the state currently being read, the one or more managing circuits ground all other bit lines of the plurality of bit lines to establish second bias conditions.

19. The system of claim 13, wherein to establish first bias conditions the one or more managing circuits pre-charge those bit lines that have a non-volatile storage element to be programmed to the state currently being verified, the one or more managing circuits ground all other bit lines of the plurality of bit lines to establish first bias conditions.

20. The system of claim 19, wherein to establish the second bias conditions the one or more managing circuits pre-charge all bit lines of the plurality of bit lines, the one or more managing circuits perform a rough read at a voltage level associated with the highest programmed state of the plurality of programmed states to establish a first set of the second bias conditions for reading at the highest programmed state, the one or more managing circuits perform a rough read at a voltage level associated with the next highest programmed state of the plurality of programmed states, the one or more managing circuits discharge all bit lines that have a non-volatile storage element with a threshold voltage above the voltage associated with the next highest programmed state to after the rough read at a voltage level associated with the next highest programmed state establish a second set of the second bias conditions for reading at the next highest programmed state, the one or more managing circuits perform a rough read at a voltage level associated with the lowest programmed state of the plurality of programmed states, the one or more managing circuits discharge all bit lines that have a non-volatile storage element with a threshold voltage above the voltage associated with state above the lowest programmed state after the rough read at a voltage level associated with the lowest programmed state to establish a third set of the second bias conditions for reading at the lowest programmed state.

21. The system of claim 13, wherein to establish first bias conditions the one or more managing circuits pre-charge those bit lines that have a non-volatile storage element to be programmed to the state currently being verified and bit lines that have a non-volatile storage element to be programmed to any higher programmed states than the state currently being verified the one or more managing circuits ground all other bit lines of the plurality of bit lines to establish first bias conditions.

22. The system of claim 21, wherein to establish the second bias conditions the one or more managing circuits pre-charge all bit lines of the plurality of bit lines, the one or more managing circuits perform a rough read at a voltage level associated with the lowest programmed state of the plurality of programmed states to establish a first set of the second bias conditions for reading at the lowest programmed state, the one or more managing circuits perform a rough read at a voltage level associated with the next highest programmed state of the plurality of programmed states to establish a second set of the second bias conditions for reading at the next highest programmed state, the one or more managing circuits perform a rough read at a voltage level associated with the highest programmed state of the plurality of programmed states to establish a third set of the second bias conditions for reading at the highest programmed state.

23. The system of claim 13, wherein the one or more managing circuits store first values for respective memory cells that indicate that the respective memory cell has reached a coarse verify level when verifying each of a plurality of programmed states, the one or more managing circuits overwrite values in a data latch that indicate the state to be programmed into respective memory cells when the respective memory cell reaches a fine verify level when verifying each of a plurality of programmed state, the one or more managing circuits combine the first value for a given memory cell with the present values in the data latch for the given memory cell to determine how to establish first bias conditions for the bit line for the given memory cell.

24. A system comprising:

a plurality of non-volatile storage elements;

a plurality of bit lines that are associated with the plurality of non-volatile storage elements;

a plurality of word lines that are associated with the plurality of non-volatile storage elements, the plurality of word lines includes a first word line; and one or more managing circuits that are in communication with the plurality of non-volatile storage elements, the plurality of bit lines, and the plurality of word lines, the one or more managing circuits establish a first voltage level on a first group of the bit lines, establishing the first voltage level is performed as part of a program verify operation to verify whether threshold voltages are at a target level associated with a first programmed state of a plurality of programmed states, the first group of bit lines includes at least those bits lines that have a non-volatile storage element of the plurality of non-volatile storage elements that is to be programmed to the first state; the one or more managing circuits establish a ground voltage on a second group of the plurality of bit lines as part of the program verify operation, the second group of bit lines includes all bit lines in the plurality of bit lines other than the first group of bit lines, the second group of bit lines includes at least some bit lines that have a non-volatile storage element associated with the first word line that is to be programmed to a programmed state other than the first programmed state, the one or more managing circuits perform at least one read of the non-volatile storage elements associated with the first word line to roughly determine which of the bit lines were in the first group and which of the bit lines were in the second group during the verify operation, the one or more managing circuits establish a ground voltage on the bit lines that were roughly determined to be in the second group, the one or more managing circuits perform a fine read of the plurality of non-volatile storage elements associated with the first word line to determine which of the non-volatile storage elements have of threshold voltage of at least the target level, performing the fine read includes the one or more managing circuits biasing the bit lines that were roughly determined to be in the first group at a second voltage level while biasing the bit lines that were roughly determined to be in the second group at ground.

*25. The method of claim 1, wherein:*

*the plurality of non-volatile storage elements are arranged in a three-dimensional memory structure.*

*26. The method for operating a non-volatile storage system of claim 12, wherein:*

*the non-volatile storage system comprises a three-dimensional memory array, the three-dimensional memory array comprises the plurality of non-volatile storage elements.*

*27. The system of claim 13, wherein:*

*the system comprises a three-dimensional memory array, the three-dimensional memory array comprises the plurality of non-volatile storage elements.*

*28. The system of claim 13, wherein:*

*the plurality of non-volatile storage elements comprise a non-conductive dielectric material to store charge in a non-volatile manner.*

*29. The system of claim 24, further comprising:*

*a three-dimensional memory array, the three-dimensional memory array comprises the plurality of non-volatile storage elements.*

*30. The system of claim 24, wherein:*

*the plurality of non-volatile storage elements comprise a nitride charge trapping region, the one or more managing circuits program the plurality of non-volatile storage elements by injecting electrons into the nitride charge trapping region.*

* * * * *

UNITED STATES PATENT AND TRADEMARK OFFICE

CERTIFICATE OF CORRECTION

PATENT NO. : RE45,953 E
APPLICATION NO. : 14/285446
DATED : March 29, 2016
INVENTOR(S) : Dong et al.

It is certified that error appears in the above-identified patent and that said Letters Patent is hereby corrected as shown below:

In the claims

Col. 35, lines 53-54: After “storage” and before “on” delete “elements” and insert -- element --

Col. 37, lines 3-4: After “have” and before “threshold” delete “of” and insert -- a --

Col. 38, line 26: After “storage” and before “on” delete “elements” and insert -- element --

Col. 38, line 44: After “wherein” and before “establishing” delete “to”

Col. 40, line 6: After “programmed” and before “the” delete “state,” and insert -- states, --

Col. 40, lines 51-52: After “have” and before “threshold” delete “of” and insert -- a --

Signed and Sealed this
Second Day of August, 2016

Michelle K. Lee

Michelle K. Lee
*Director of the United States Patent and Trademark Office*